(12) United States Patent
Heinzmann et al.

(10) Patent No.: US 9,126,497 B2
(45) Date of Patent: Sep. 8, 2015

(54) APPARATUS AND METHODS FOR CONTROL OF A VEHICLE

(71) Applicant: Segway, Inc., Bedford, NH (US)

(72) Inventors: John David Heinzmann, Manchester, NH (US); Jon M. Stevens, Manchester, NH (US); Raymond Debruin, Merrimack, NH (US); Anthony Foale, New Boston, NH (US); Joseph Hoell, Jr., Dunbarton, NH (US); Patrick A. Hussey, Hollis, NH (US); Alexander Muller, Manchester, NH (US)

(73) Assignee: SEGWAY, iNC., Bedford, NH (US)

( * ) Notice: Subject to any disclaimer, the term of this patent is extended or adjusted under 35 U.S.C. 154(b) by 0 days.

(21) Appl. No.: 13/946,495

(22) Filed: Jul. 19, 2013

(65) Prior Publication Data
US 2014/0188316 A1    Jul. 3, 2014

Related U.S. Application Data

(63) Continuation of application No. 13/036,354, filed on Feb. 28, 2011, now Pat. No. 8,490,723.

(60) Provisional application No. 61/308,659, filed on Feb. 26, 2010.

(51) Int. Cl.
*B62K 3/00* (2006.01)
*B60L 11/18* (2006.01)
(Continued)

(52) U.S. Cl.
CPC .............. *B60L 11/1861* (2013.01); *B60L 15/20* (2013.01); *B62J 17/08* (2013.01); *B62K 3/007* (2013.01); *G01R 31/3648* (2013.01);
(Continued)

(58) Field of Classification Search
USPC ......................................... 180/701, 218, 65.1
See application file for complete search history.

(56) References Cited

U.S. PATENT DOCUMENTS

| 584,127 A | 6/1897 | Draullette et al. .............. 180/6.2 |
| 734,109 A | 7/1903 | Tolcher ......................... 280/205 |

(Continued)

FOREIGN PATENT DOCUMENTS

| DE | 44 04 594 A1 | 8/1995 | ............... B62D 1/12 |
| EP | 0 537 698 | 4/1993 | ........... B62D 55/075 |

(Continued)

OTHER PUBLICATIONS

Kawaji, S., *Stabilization of Unicycle Using Spinning Motion*, Denki Gakkai Ronbush, vol. 107-D, Issue 1, Jan. 1987, pp. 21-28.

(Continued)

*Primary Examiner* — Tony Winner
(74) *Attorney, Agent, or Firm* — Burns & Levinson LLP; Joseph M. Maraia

(57) ABSTRACT

Method for controlling a vehicle that includes a support, at least one wheel, a platform coupled to the at least one wheel, a coupling structure having a support portion coupled to the support and a platform portion coupled to the platform that allows the support portion to move or slide fore and aft with respect to the platform portion, an actuator coupled to the coupling structure to control the position of the support portion relative to the platform portion, a drive coupled to the at least one wheel to deliver power to the at least one wheel to propel the vehicle and maintain the platform level, and a controller coupled to the drive to control the drive and coupled to the actuator to control the actuator.

6 Claims, 11 Drawing Sheets

(51) Int. Cl.
| | |
|---|---|
| *B62J 17/08* | (2006.01) |
| *G05D 1/08* | (2006.01) |
| *B60L 15/20* | (2006.01) |
| *G01R 31/36* | (2006.01) |
| *A61G 5/04* | (2013.01) |
| *A61G 5/10* | (2006.01) |

(52) U.S. Cl.
CPC ............ *G05D 1/0891* (2013.01); *A61G 5/043* (2013.01); *A61G 5/1016* (2013.01); *B60L 2200/16* (2013.01); *B60L 2200/24* (2013.01); *Y02T 10/7258* (2013.01)

(56) References Cited

U.S. PATENT DOCUMENTS

| | | | |
|---|---|---|---|
| 3,145,797 A | 8/1964 | Taylor | 180/21 |
| 3,260,324 A | 7/1966 | Suarez | 180/10 |
| 3,399,742 A | 9/1968 | Maliek | 180/21 |
| 3,446,304 A | 5/1969 | Alimanestiano | 180/9.24 |
| 3,580,344 A | 5/1971 | Floyd | 180/8 A |
| 4,062,558 A | 12/1977 | Wasserman | 280/205 |
| 4,088,199 A | 5/1978 | Trautwein | 180/25 R |
| 4,094,372 A | 6/1978 | Notter | 180/1 G |
| 4,151,892 A | 5/1979 | Francken | 180/77 H |
| 4,222,449 A | 9/1980 | Feliz | 180/8 A |
| 4,293,052 A | 10/1981 | Daswick et al. | 180/219 |
| 4,354,569 A | 10/1982 | Eichholz | 180/211 |
| 4,373,600 A | 2/1983 | Buschbom et al. | 180/212 |
| 4,560,022 A | 12/1985 | Kassai | 180/65.1 |
| 4,566,707 A | 1/1986 | Nitzberg | 180/8.2 |
| 4,571,844 A | 2/1986 | Komasaku et al. | 33/366 |
| 4,624,469 A | 11/1986 | Bourne, Jr. | 280/112 A |
| 4,657,272 A | 4/1987 | Davenport | 280/266 |
| 4,709,772 A | 12/1987 | Brunet | 180/8.2 |
| 4,716,980 A | 1/1988 | Butler | 180/19.2 |
| 4,790,548 A | 12/1988 | Decelles et al. | 280/5.26 |
| 4,794,999 A | 1/1989 | Hester | 180/8.2 |
| 4,809,804 A | 3/1989 | Houston et al. | 180/65.5 |
| 4,834,200 A | 5/1989 | Kajita | 180/8.1 |
| 4,998,596 A | 3/1991 | Miksitz | 180/213 |
| 5,221,883 A | 6/1993 | Takenaka et al. | 318/568.12 |
| 5,248,007 A | 9/1993 | Watkins et al. | 180/9.32 |
| 5,314,034 A | 5/1994 | Chittal | 180/21 |
| 5,366,036 A | 11/1994 | Perry | 180/65.1 |
| 5,439,240 A | 8/1995 | Tichenor et al. | 280/250.1 |
| 5,487,441 A | 1/1996 | Endo et al. | 180/181 |
| 5,701,965 A * | 12/1997 | Kamen et al. | 180/7.1 |
| 5,701,968 A | 12/1997 | Wright-Ott et al. | 180/65.1 |
| 5,791,425 A | 8/1998 | Kamen et al. | 180/7.1 |
| 5,971,091 A * | 10/1999 | Kamen et al. | 180/218 |
| 5,973,463 A | 10/1999 | Okuda et al. | 318/430 |
| 5,975,225 A | 11/1999 | Kamen et al. | 180/7.1 |
| 6,003,624 A | 12/1999 | Jorgensen et al. | 180/6.5 |
| 6,050,357 A | 4/2000 | Staelin et al. | 180/65.1 |
| 6,059,062 A | 5/2000 | Staelin et al. | 180/181 |
| 6,223,104 B1 | 4/2001 | Kamen et al. | 701/1 |
| 6,225,977 B1 | 5/2001 | Li | 345/156 |
| 6,288,505 B1 | 9/2001 | Heinzmann et al. | 318/139 |
| 6,302,230 B1 | 10/2001 | Kamen et al. | 180/171 |
| 6,311,794 B1 * | 11/2001 | Morrell et al. | 180/8.3 |
| 6,332,103 B1 | 12/2001 | Steenson, Jr. et al. | 701/1 |
| 6,538,411 B1 * | 3/2003 | Field et al. | 318/638 |
| 6,553,271 B1 | 4/2003 | Morrell | 700/75 |
| 6,571,892 B2 | 6/2003 | Kamen et al. | 180/8.2 |
| 6,581,714 B1 | 6/2003 | Kamen et al. | 180/333 |
| 6,789,640 B1 | 9/2004 | Arling et al. | 180/282 |
| 7,004,271 B1 | 2/2006 | Kamen et al. | 180/21 |
| 2002/0063006 A1 | 5/2002 | Kamen et al. | 180/171 |
| 2002/0121394 A1 | 9/2002 | Kamen et al. | 180/41 |
| 2003/0014167 A1 | 1/2003 | Pedersen et al. | 701/37 |
| 2004/0007425 A1 | 1/2004 | Kamen et al. | 182/141 |
| 2006/0249313 A1 | 11/2006 | Kamen et al. | 180/7.1 |
| 2007/0145697 A1 | 6/2007 | Kamen et al. | 280/11 |
| 2010/0114468 A1 * | 5/2010 | Field et al. | 701/124 |
| 2010/0168993 A1 * | 7/2010 | Doi et al. | 701/124 |

FOREIGN PATENT DOCUMENTS

| | | | |
|---|---|---|---|
| EP | 0 958 978 | 11/1999 | ............... B60T 8/00 |
| EP | 2 017 172 | 1/2009 | ............... B60L 15/20 |
| FR | 980 237 | 5/1951 | ........................ 10/1 |
| GB | 2 139 576 A | 11/1984 | ............... B62B 5/02 |
| GB | 2388579 | 11/2003 | ............. B60K 23/08 |
| JP | 57-87766 | 6/1982 | ............. B62D 37/00 |
| JP | 62-12810 | 1/1987 | ............. G01C 19/04 |
| JP | 63-305082 | 12/1988 | ............... G05D 1/08 |
| JP | 4201793 | 7/1992 | ............... B62K 1/00 |
| JP | 2007-1861784 A | 7/2007 | |
| JP | 2008-238930 A | 10/2008 | |
| WO | 89/06117 | 7/1989 | ............... A61G 5/04 |
| WO | 96/23478 | 8/1996 | ............... A61G 5/04 |
| WO | 00/74623 | 12/2000 | ............... B62K 3/16 |
| WO | 00/75001 | 12/2000 | ............... B62K 1/00 |
| WO | 03/106250 | 12/2003 | ............. B60L 11/18 |
| WO | 2004/007264 | 1/2004 | ............. B62D 51/02 |
| WO | 2009/004844 | 1/2009 | ............. B62K 17/00 |

OTHER PUBLICATIONS

Schoonwinkel., A., *Design and Test of a Computer-Stabilized Unicycle*, Department of Aeronautics and Astronautics, Stanford University, Dec. 1987.

Vos, D., *Dynamics and Nonlinear Adaptive Control of an Autonomous Unicycle*, Massachusetts Institute of Technology, 1989.

Vos, D., *Nonlinear Control of an Autonomous Unicycle Robot: Practical Issues*, Massachusetts Institute of Technology, 1992.

Koyanagi et al., *A Wheeled Inverse Pendulum Type Self-Contained Mobile Robot and its Posture Control and Vehicle Control, The Society of Instrument and Control Engineers*, Special Issue of the 31$^{st}$ SICE Annual Conference, Japan, 1992, pp. 13-16.

Koyanagi et al., *A Wheeled Inverse Pendulum Type Self-Contained Mobile Robot and its Two Dimensional Trajectory Control, Proceeding of the Second Internation Symposium on Measurement and Control in Robotics*, Japan 1992, pp. 891-898.

Koyanagi et al., *A Wheeled Inverse Pendulum Type Self-Contained Mobile Robot and its Posture Control and Vehicle Control, The Society of Instrument and Control Engineers*, Special Issue of the 31$^{st}$ SICE Annual Conference, Japan, 1992, pp. 51-56.

Osaka et al., *Stabilization of unicycle, Systems and Control*, vol. 25, No. 3, Japan 1981, pp. 159-166.

Vos et al., *Dynamics and Nonlinear Adaptive Control of an Autonomous Unicycle—Theory and Experiment, American Institute of Aeronautics and Astronautics*, A90-26772 10-39, Washington, D.C. 1990, pp. 487-494. (abstract only).

Kanoh, *Adaptive Control of Inverted Pendulum, Computrol*, vol. 2 (1983), pp. 69-75.

Yamafuji, *A Proposal for Modular-Structured Mobile Robots for Work that Principally Involve a Vehicle with Two Parallet Wheels, Automation Technology*, vol. 20, pp. 113-118 (1998).

Yamafuji et al., *Study of Postural and Driving Control of Coaxial Bicycle*, Paper Read at Meeting of Japan Society of Mechanical Engineering (Series C), vol. 54 No. 501, (May 1998), pp. 1114-1121.

Yamafuji et al., *Synchronization and Steering Control of Parallel Bicycle*, Paper Read at Meeting of Japan Society of Mechanical Engineering (Series C), vol. 55, No. 513, (May 1989), pp. 1229-1234.

Momoi et al., *Motion Control of the Parallel Bicycle-Type Mobile Robot Composed of a Triple Inverted Pendulum*, Paper Read at Meeting of Japan Society of Mechanical Engineering (Series C), vol. 57, No. 541, (Sep. 1991), pp. 154-159.

Notice of Reasons for Refusal for Japanese Patent Application No. 2012-555207 dated Dec. 2, 2014.

Notice of Intention to Grant for European Patent Application No. 11714144.0 dated Mar. 16, 2015.

* cited by examiner

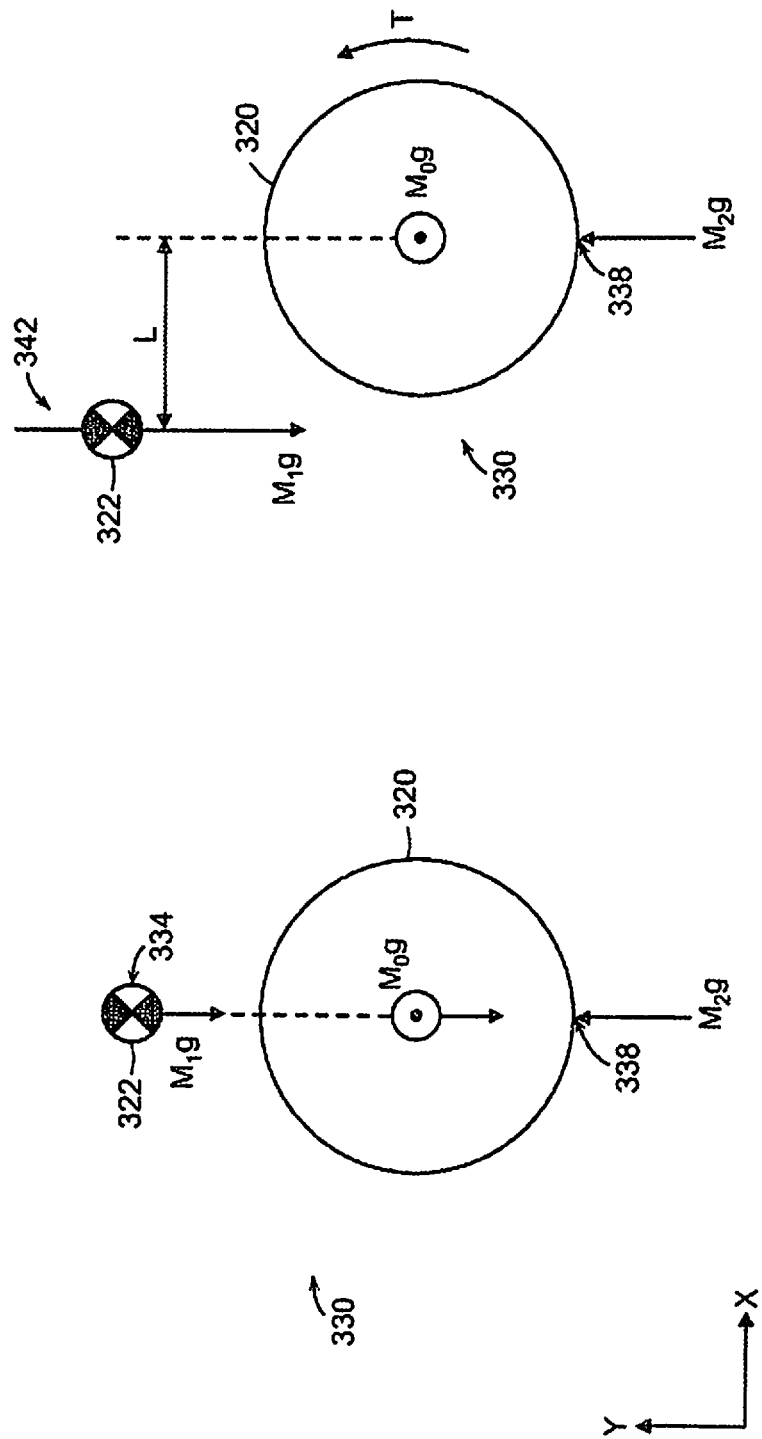

APPARATUS AND METHODS FOR CONTROL OF A VEHICLE

RELATED APPLICATIONS

The present application is a Continuation of U.S. and application Ser. No, 13/036,354, flied Feb. 28, 2011, now U.S. Pat. No, 8,490,723 B2, issued Jul. 23, 2013, which claims priority to U.S. provisional patent application number 61/308,659, filed Feb. 26, 2010, which is Incorporated in its entirety herein by reference.

FIELD OF THE INVENTION

The present invention pertains to control of electric vehicles, and in particular, controlling electric vehicle motion.

BACKGROUND OF THE INVENTION

A wide range of vehicles and methods are known for transporting human subjects. Typically, such vehicles rely upon static stability and are designed for stability under all foreseen conditions of placement of their ground-contacting members with an underlying surface. For example, a gravity vector acting on the center of gravity of an automobile passes between the points of ground contact of the automobile's wheels and the suspension of the automobile keeps all wheels on the ground at all times making the automobile stable. Although, there are conditions (e.g., increase or decrease in speed, sharp turns and steep slopes) which cause otherwise stable vehicles to become unstable.

A dynamically stabilized vehicle, also known as a balancing vehicle, is a type of vehicle that has a control system that actively maintains the stability of the vehicle while the vehicle is operating. In a vehicle that has only two laterally-disposed wheels, for example, the control system maintains the fore-aft stability of the vehicle by continuously sensing the orientation of the vehicle, determining the corrective action necessary to maintain stability, and commanding the wheel motors to make the corrective action. If the vehicle losses the ability to maintain stability, such as through the failure of a component or a lack of sufficient power, the human subject can experience a sudden loss of balance.

For vehicles that maintain a stable footprint, coupling between steering control and control of the forward motion of the vehicles is less of a concern. Under typical road conditions, stability is maintained by virtue of the wheels being in contact with the ground throughout the course of a turn. In a balancing vehicle with two laterally disposed wheels, however, any torque applied to one or more wheels affects the stability of the vehicle.

SUMMARY OF THE INVENTION

The invention, in aspect, features a method for transitioning a vehicle from a statically-stable state to a dynamically-balanced state. The vehicle includes a support, at least one wheel, a coupling structure having a support portion coupled to the support and a ground portion coupled to the at least one wheel that allows the support portion to move or slide fore and aft with respect to the platform portion, a drive coupled to the at least one wheel to dynamically balance the vehicle and provide power to the at least one wheel to propel the vehicle, an actuator coupled to the coupling structure to control the position of the support portion relative to the platform portion, a controller coupled to the drive to control the drive and coupled to the actuator to control the actuator, and landing gear coupled to the vehicle, wherein the combination of the landing gear and the at least one wheel maintain the vehicle in the statically-stable state when the vehicle is operating in the statically-stable state. The method includes controlling the drive to command the at least one wheel to hold a zero speed condition and to hold the vehicle in a stationary position with respect to an underlying surface. The method also includes controlling the actuator to move or slide the position of the support portion relative to the platform portion to alter the vehicle center of gravity position toward a location where the vehicle is capable of balancing with the at least one wheel. The method also includes initiating dynamic balancing of the vehicle with the at least one wheel when the location of the vehicle center of gravity satisfies a predetermined condition.

In some embodiments, the predetermined condition is satisfied when a load applied by the underlying surface to the landing gear is less than a predefined amount. In some embodiments, the load applied by the underlying surface to the landing gear using a fluid pressure sensor coupled to a hydraulic braking system coupled to the landing gear of the vehicle. In some embodiments, the predetermined condition is satisfied when the vehicle pitches backward and the landing gear is no longer in contact with the underlying surface.

In some embodiments, the predetermined condition is satisfied when the position of the support portion relative to the platform portion approaches a predefined threshold position. In some embodiments, the method includes controlling the position of the support portion relative to the platform portion and pitch of the vehicle to level the support. In some embodiments, the method includes controlling the drive to disable the command that held the at least one wheel to a zero speed condition and held the vehicle in a stationary position with respect to the underlying surface.

The invention, n another aspect, features a dynamically-balancing vehicle that includes a support, at least one wheel, and a coupling structure having a support portion coupled to the support and a platform portion coupled to the at least one wheel that allows the support portion to move or slide fore and aft with respect to the platform portion. The vehicle also includes a drive coupled to the at least one wheel to dynamically balance the vehicle and provide power to the at least one wheel to propel the vehicle and an actuator coupled to the coupling structure to control the position of the support portion relative to the platform portion. The vehicle also includes landing gear coupled to the vehicle, wherein the combination of the landing gear and the at least one wheel maintain the vehicle in a statically-stable state when the vehicle is operating in the statically-stable state. The vehicle also includes a controller coupled to the drive to control the drive and coupled to the actuator to control the actuator, the controller configured for transitioning the vehicle from the statically-stable state to the dynamically-balanced state. The controller is configured to control the drive to command the at least one wheel to hold a zero speed condition and to hold the vehicle in a stationary position with respect to an underlying surface, control the actuator to move or slide the position of the support portion relative to the platform portion to alter the vehicle center of gravity position toward a location where the vehicle is capable of balancing with the at least one wheel, and initiate dynamic balancing of the vehicle with the at least one wheel when the location of the vehicle center of gravity satisfies a predetermined condition.

In some embodiments, the predetermined condition is satisfied when a load applied by the underlying surface to the landing gear is less than a predefined amount. In some embodiments, the vehicle includes a fluid pressure sensor coupled to a hydraulic braking system coupled to the landing gear of the vehicle, wherein the fluid pressure sensor is used to determine the load applied by the underlying surface to the landing gear. In some embodiments, the predetermined condition is satisfied when the vehicle pitches backward and the landing gear is no longer in contact with the underlying surface. In some embodiments, the predetermined condition is satisfied when the position of the support portion relative to the platform portion approaches a predefined threshold position.

In some embodiments, the controller controls the drive and the actuator to control the position of the support portion relative to the platform portion and the pitch of the vehicle to level the support. In some embodiments, the controller controls the drive to disable the command that held the at least one wheel to a zero speed condition and held the vehicle in a stationary position with respect to the underlying surface. In some embodiments, the landing gear comprises one or more wheels.

The invention, in another aspect, features a method for transitioning a vehicle from a dynamically-balanced state to a statically-stable state, the vehicle includes a support, at least one wheel, a coupling structure having a support portion coupled to the support and a platform portion coupled to the at least one wheel that allows the support portion to move or slide fore and aft with respect to the platform portion, a drive coupled to the at least one wheel to dynamically balance the vehicle and provide power to the at least one wheel to propel the vehicle, an actuator coupled to the coupling structure to control the position of the support portion relative to the platform portion, a controller coupled to the drive to control the drive and coupled to the actuator to control the actuator, and landing gear coupled to the vehicle, wherein the combination of the landing gear and the at least one wheel maintain the vehicle in a statically-stable state when the vehicle is operating in the statically-stable state. The method includes commanding the actuator to control the position of the support portion relative to the platform portion to hold a zero speed condition and to hold the vehicle in a stationary position with respect to an underlying surface, controlling the drive to pitch the vehicle forward while maintaining the vehicle in the dynamically-balanced state, and terminating dynamic balancing of the vehicle when a landing configuration condition is satisfied.

In some embodiments, the method includes controlling the vehicle to prevent the vehicle from pitching backward after commanding the actuator to control the position of the support portion relative to the platform portion to hold a zero speed condition and to hold the vehicle in a stationary position with respect to an underlying surface. In some embodiments, the landing configuration condition is satisfied when a load applied by the underlying surface to the landing gear is greater than a predefined amount. In some embodiments, the method includes determining the load applied by the underlying surface to the landing gear using a fluid pressure sensor coupled to a hydraulic braking system coupled to the landing gear of the vehicle.

In some embodiments, the landing configuration condition is satisfied when the landing gear is in contact with the underlying surface. In some embodiments, the landing configuration condition is satisfied when the position of the support portion relative to the platform portion approaches a predefined threshold position. In some embodiments, the method includes following terminating balancing of the vehicle, moving the support portion relative to the platform portion in a direction towards the landing gear. In some embodiments, prior to terminating dynamic balancing of the vehicle, the method comprises commanding the actuator to move the support portion relative to the platform portion in a direction towards the landing gear.

The invention, in another aspect, features a dynamically-balancing vehicle. The vehicle includes a support, at least one wheel and a coupling structure having a support portion coupled to the support and a platform portion coupled to the at least one wheel that allows the support portion to move or slide fore and aft with respect to the platform portion. The vehicle also includes a drive coupled to the at least one wheel to dynamically balance the vehicle and provide power to the at least one wheel to propel the vehicle and an actuator coupled to the coupling structure to control the position of the support portion relative to the platform portion. The vehicle also includes landing gear coupled to the vehicle, wherein the combination of the landing gear and the at least one wheel maintain the vehicle in a statically-stable state when the vehicle is operating in statically-stable state and a controller coupled to the drive to control the drive and coupled to the actuator to control the actuator. The controller is configured for transitioning the vehicle from the dynamically-balanced state to the statically-stable state. The vehicle is also configured to command the actuator to control the position of the support portion relative to the platform portion to hold a zero speed condition and to hold the vehicle in a stationary position with respect to an underlying surface, control the drive to pitch the vehicle forward while maintaining the vehicle in the dynamically-balanced state, and terminate dynamic balancing of the vehicle when a landing configuration condition is satisfied.

In some embodiments, the landing configuration condition is satisfied when a load applied by the underlying surface to the landing gear is greater than a predefined amount. In some embodiments, the vehicle includes a fluid pressure sensor coupled to a hydraulic braking system coupled to the landing gear of the vehicle, wherein the fluid pressure sensor is used to determine the load applied by the underlying surface to the landing gear.

In some embodiments, the landing configuration is satisfied when the landing gear is in contact with the underlying surface. In some embodiments, the landing configuration is satisfied when the position of the support portion relative to the platform portion approaches a predefined threshold position. In some embodiments, the controller is configured to move the support portion relative to the platform portion in a direction towards the landing gear following terminating dynamic balancing of the vehicle. In some embodiments, the controller is configured to command the actuator to move the support portion relative to the platform portion in a direction towards the landing gear prior to terminating dynamic balancing of the vehicle.

The invention, in another aspect, features a dynamically-balancing vehicle. The vehicle includes a support for supporting a payload, at least a first and second wheel coupled to the support, and a drive coupled to the first and second wheels to dynamically balance the vehicle and provide power to the first and second wheels to propel the vehicle. The vehicle also includes a controller coupled to the drive to control the drive. The vehicle also includes at least a third wheel coupled to the support and disposed fore or aft of the first and second wheels, wherein the combination of the first, second and third wheels maintain the vehicle in a statically-stable state when the vehicle is operating in the statically-stable state, and a braking system comprising brakes coupled to the first and second wheels, and an actuator assembly coupled to the third wheel for engaging and disengaging the brakes, wherein the actuator assembly engages the brakes when the third wheel contacts an underlying surface and disengages the brakes when the third wheel lifts off the underlying surface.

In some embodiments, the actuator assembly comprises a master cylinder, and the brakes comprise hydraulic brakes, and wherein the braking system comprises a hydraulic line coupling the master cylinder to the hydraulic brakes. In some embodiments, the vehicle includes a fourth wheel coupled to the support that includes a master cylinder, wherein all the master cylinders and the brakes are coupled together by hydraulic lines.

In some embodiments, each of the brakes is configured to engage in response to one or more master cylinders being compressed. In some embodiments, the vehicle includes a fluid pressure sensor coupled to the hydraulic lines to measure hydraulic pressure in the hydraulic lines to determine the load applied by the underlying surface to the second wheel. In some embodiments, the vehicle includes a brake sensor for providing a brake-state signal to the controller. In some embodiments, the controller is configured to prohibit the vehicle from entering a balancing mode when the brake-state signal is indicative of the brakes being engaged.

The invention, in another aspect, features a method for braking a dynamically-balancing vehicle. The vehicle includes a support for supporting a payload, at least a first and second wheel coupled to the support, a drive coupled to the first and second wheels to dynamically balance the vehicle and provide power to the first and second wheels to propel the vehicle, a controller coupled to the drive to control the drive, at least a second wheel coupled to the support and disposed fore or aft of the first and second wheels, wherein the combination of the first, second and third wheels maintain the vehicle in a statically-stable state when the vehicle is operating in the statically-stable state, and a braking system comprising brakes coupled to the first and second wheels, and an actuator assembly coupled to the third wheel. The method includes engaging the brakes with the actuator assembly when the third wheel contacts an underlying surface, and disengaging the brakes with the actuator assembly when the third wheel lifts off the underlying surface.

In some embodiments, the actuator assembly includes a master cylinder, and the brakes comprise hydraulic brakes, and wherein the braking system comprises a hydraulic line coupling the master cylinder to the hydraulic brakes. In some embodiments, the vehicle includes a fourth wheel coupled to the support that includes a master cylinder, wherein all the master cylinders and the brakes are coupled together by hydraulic lines. In some embodiments, the method includes engaging each of the brakes in response to one or more master cylinders being compressed.

In some embodiments, the method includes engaging the brakes with the actuator assembly in response to a master cylinder being compressed. In some embodiments, the method includes measuring hydraulic pressure in the hydraulic line to determine load applied by the underlying surface to the third wheel. In some embodiments, the method includes monitoring a brake-state signal to determine whether the brakes are engaged. In some embodiments, the method includes prohibiting the vehicle from entering a balancing mode when the brake-state signal is indicative of the brakes being engaged.

BRIEF DESCRIPTION OF THE DRAWINGS

The foregoing features of the invention will be more readily understood by reference to the following detailed description, taken with reference to the accompanying drawings, in which:

FIG. 3A is a block diagram of position of the center of gravity of a vehicle with respect to a ground-contacting element of the vehicle.

FIG. 3B is a block diagram of an alternative position of the center of gravity of the vehicle of FIG. 3A with respect to a ground-contacting element of the vehicle.

DETAILED DESCRIPTION OF ILLUSTRATIVE EMBODIMENTS

Figure 1:
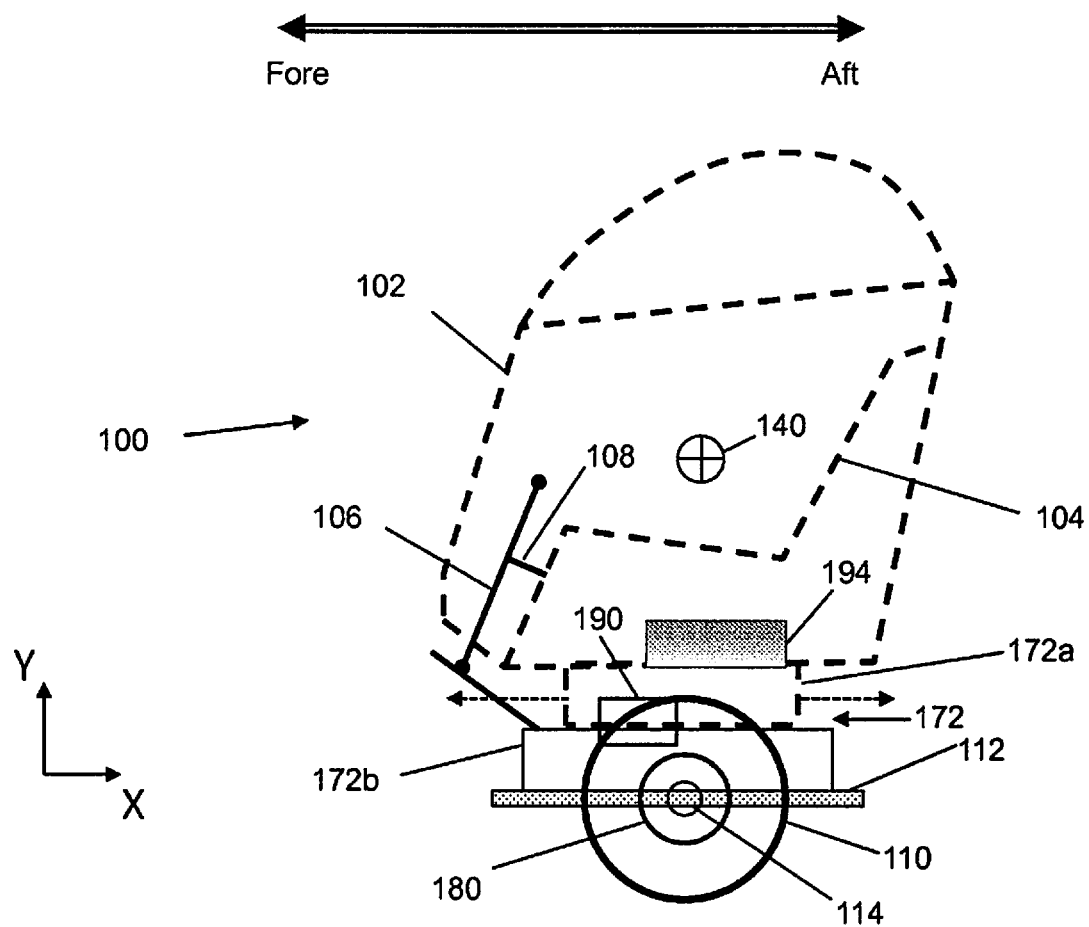
FIG. 1 is a schematic illustration of a vehicle, according to an illustrative embodiment of the invention.

FIG. 1 is a schematic illustration of a vehicle 100, according to an illustrative embodiment of the invention. The vehicle 100 includes an enclosure 102 coupled to a support 104. The vehicle 100 also includes at least one ground-contacting element 110 (e.g., one or more wheels) coupled to a platform 112. The ground-contacting element 110 rotates about an axle 114 which is coupled to the platform 112. The vehicle 100 also includes a coupling structure 172 that includes a support portion 172a coupled to the support 104 and a platform portion 172b coupled to the platform 112. The coupling structure 172 allows the support portion 172a to move or slide for and aft with respect to the platform portion 172b.

In this embodiment, the coupling structure 172 is a slide assembly, and the support portion 172a is a rail and the platform portion 172b is a rail guide. In this embodiment, a human subject (not shown) manipulates an input device 106 to cause a position of a center of gravity 140 of the vehicle 100 to change. The input device 106 is coupled to a linkage 108. The linkage 108 is coupled to the support 104. The input device 106 can be, for example, a control stick, yoke, steering wheel or handlebar.

The human subject pushes the input device 106 forward (toward the negative X-Axis direction) which moves the enclosure 102 and support 104 forward (toward the negative X-Axis direction) relative to the ground-contacting element 110. The position of the center of gravity 140 of the vehicle 100 moves forward in response to the enclosure 102 and support 104 moving forward. A forward torque is generated by the ground-contacting element 110 in response to the center of gravity 140 of the vehicle 100 moving forward. The human subject pulls the input device 106 backward (toward the human subject's body and along the positive X-Axis direction) which moves the enclosure 102 and support 104 backward (toward the positive X-Axis direction) relative to the ground-contacting element 110. The position of the center of gravity 140 of the vehicle 100 moves backward in response to the enclosure 102 and support 104 moving backward. A negative torque is generated by the ground-contacting element 110 in response to the position of the center of gravity 140 of the vehicle 100 moving backward.

The vehicle 100 also includes an actuator 190 coupled to the coupling structure 172 to control the position of the support portion 172a relative to the platform portion 172b. The vehicle 100 also includes a drive 180 coupled to the platform 112 and the ground-contacting element 110. The drive 180 (e.g., a motorized drive) delivers power to the ground-contacting element 110 to cause rotation of the ground-contacting element 110 to propel/move the vehicle fore (towards the negative X-Axis direction) and aft (towards the positive X-Axis direction). The drive 180 also maintains the platform 112 at a desired orientation (e.g., level or a desired variation near level) with respect to gravity. In some embodiments, the vehicle 100 includes two or more laterally disposed (along the Z-axis, with the positive direction along the Z-axis is out of the page) ground-contacting elements 110 which assist with providing lateral stability to the vehicle 100.

The vehicle 100 also includes at least one controller 194 (e.g., controller 400 of FIG. 4) coupled to the drive 180 to control the drive 180 and coupled to the actuator 190 to control the actuator 190. The controller 194 controls balancing of the vehicle 100 in response to the position of the enclosure 102 and support 104 relative to the ground-contacting element 110 and platform 112. A human subject (not shown) manipulates the input device 106 to command the drive 180 to command rotation of the ground-contacting element 110 to move the vehicle 100 in the fore and aft directions.

In some embodiments, when the enclosure 102, support 104 and support portion 172a slide forward or backward relative to the platform portion 172b, platform 112 and ground-contacting element 110, the enclosure 102, support 104 and support portion 172a remain at a desired orientation (e.g., level or desired variation near level) relative to the underlying surface/ground. In alternative embodiments, when the enclosure 102, support 104 and support portion 172a slide forward or backward relative to the platform portion 172b, platform 112 and ground-contacting element 110, the enclosure 102, support 104 and support portion 172a pitch relative to the ground. The vehicle 100 can be adapted such that enclosure 102, support 104 and support portion 172a pitch forward when the enclosure 102, support 104 and support portion 172a slide forward, or alternatively, adapted such that enclosure 102, support 104 and support portion 172a pitch backward when the enclosure 102, support 104 and support portion 172a slide forward.

In some embodiments, the human subject shifts his/her weight forward or backward to move the position of the center of gravity to cause the vehicle to move forward or backward, respectively, without causing the enclosure 102, support 104 and support portion 172a to move relative to the platform portion 172b, platform 112 and the ground-contacting element 110.

In some embodiments, the linkage 108 is coupled to a device that provides stiffness or damping to movement of the linkage 108 to, for example, enforce particular types of inputs to the vehicle and/or enhance the human subject's experience. In some embodiments, the device limits the speed that the linkage 108 is permitted to move which limits the speed at which the position of the center of gravity 140 is permitted to change and, therefore, limits the rate of change of the speed of the vehicle 100.

In some embodiments, the device damps oscillations in the movement of the linkage 108 to reduce oscillations in the pitch control loop and/or center of gravity control loop of a controller that controls operation of the vehicle 100. In the absence of the device, oscillations induced in the linkage 108 by, for example, a human subject pushing or pulling the input device 106 would result in oscillations in the pitch and/or speed of the vehicle 100.

In some embodiments, the support portion 172a and/or platform portion 172b includes a damper to prevent the speed of the vehicle 100 from oscillating when the support portion 172a moves out of phase with respect to the platform portion 172b due to, for example, an external disturbance or on-vehicle disturbance. For example, when the vehicle 100 travels over a bump, the support portion 172a may move or slide relative to the platform portion 172b, thereby moving the position of the center of gravity 140 of the vehicle 100. Movement of the position of the center of gravity 140 fore or aft causes the vehicle 100 to accelerate or decelerate. Therefore, a damper coupling the support portion 172a to the platform portion 172b would reduce the high frequency motion otherwise induced by the bump, and reduce the variation in the speed of the vehicle 100 due to the bump. The damper would not damp lower frequency motions introduced, for example, by a human subject pushing the input device1 to command a change to the position of the center of gravity 140 of the vehicle. In some embodiments, the damper is configured to damp high frequency oscillations or impulses. The damper can be a mechanical damper coupling the support portion 172a to the platform portion 172b. In some embodiments, the damper is a damping term implemented in the controller 194.

Figure 2A:
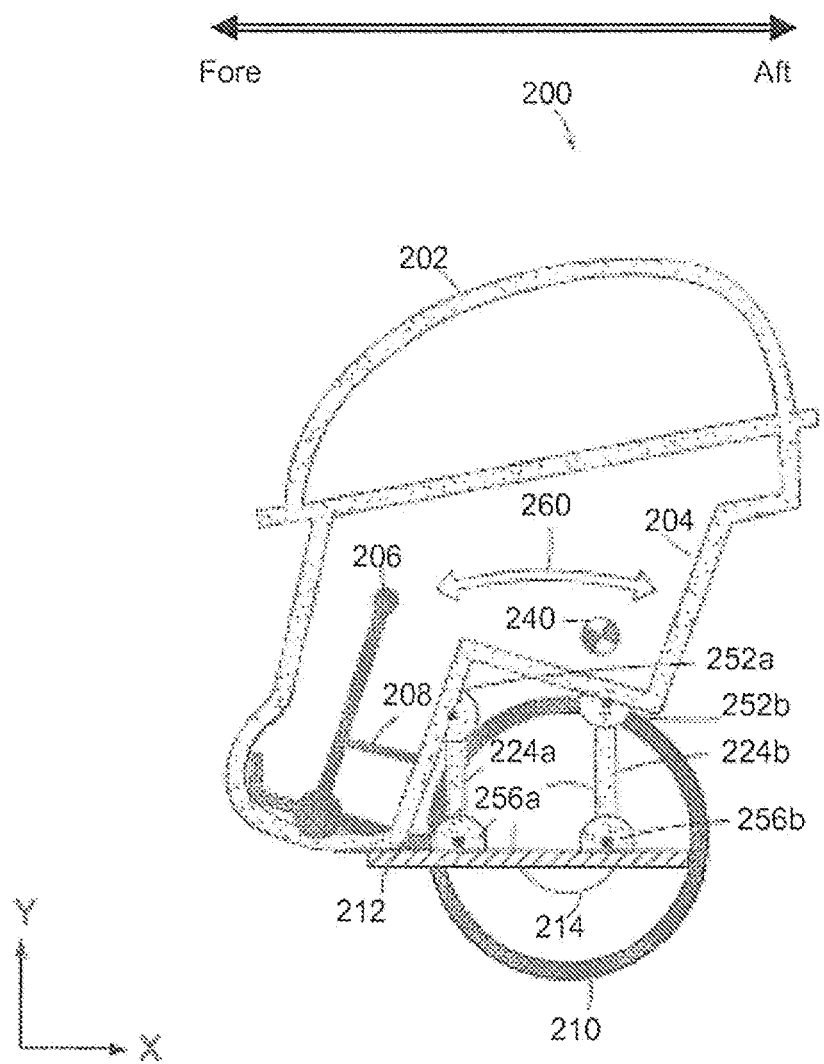
FIG. 2A is a schematic illustration of a vehicle, according to an illustrative embodiment of the invention.

FIG. 2A is a schematic illustration of a vehicle 200, according to an illustrative embodiment of the invention. The enclosure 202 is coupled to the support 204. The at least one ground-contacting element 210 is coupled to the platform 212. The ground-contacting element 210 rotates about the axle 214. The vehicle 200 also includes a coupling structure that is at least one four-bar linkage 224 (combination of first bar 224a and second bar 224b). A first end 252a of the first bar 224a is coupled to the support 204 and a first end 252b of the second bar 224b is coupled to the support 204. First end 252a and first end 252b of the bars are the support portion of the coupling structure. A second end 256a of the first bar 224a is coupled to the platform 212 and a second end 256b of the second bar 224b is coupled to the platform 212. Second end 256a and second end 256b of the bars are the platform portion of the coupling structure.

The enclosure 202 and support 204 move along a path 260 defined by a rotation of the four-bar linkage 224 in the X-Y plane. In this embodiment, a human subject (not shown) manipulates an input device 206 to cause the position of the center of gravity 240 of the vehicle 200 to change. The input device 206 is coupled to the linkage 208. The linkage 208 is coupled to the support 204. The human subject pushes the input device 206 forward (toward the negative X-Axis direction) which moves the enclosure 202 and support 204 along the path 260 defined by the rotation of the four-bar linkage 224, moving the enclosure 202 and support 204 forward (toward the negative X-Axis direction) relative to the ground-contacting element 210. The position of the center of gravity 240 of the vehicle 200 moves forward in response to the enclosure 202 and support 204 moving forward. A forward torque is generated by the ground-contacting element 210 in response to the position of the center of gravity 240 of the vehicle 200 moving forward.

The human subject pulls the input device 206 backward (toward the human subject's body and along the positive X-Axis direction) which moves the enclosure 202 and support 204 along the path 260 defined by the rotation of the four-bar linkage 224, moving the enclosure 202 and support 204 backward (toward the positive X-Axis direction) relative to the ground-contacting element 210. The position of the center of gravity 240 of the vehicle 200 moves backward in response to the enclosure 202 and support 204 moving backward. A negative torque is generated by the ground-contacting element 210 in response to the position of the center of gravity 240 of the vehicle 200 moving backward.

In some embodiments, the vehicle 200 includes two laterally disposed ground-contacting elements. The vehicle also includes two four-bar linkages (e.g., two of the four-bar linkages 224). Each four-bar linkage is coupled to one of the two laterally disposed ground-contacting elements. In some embodiments, one or more four-bar linkages are flexible bars. The flexible bars bend to permit, for example, the enclosure and support to move along a path (e.g., the path 260 of FIG. 2A).

Figure 2B:
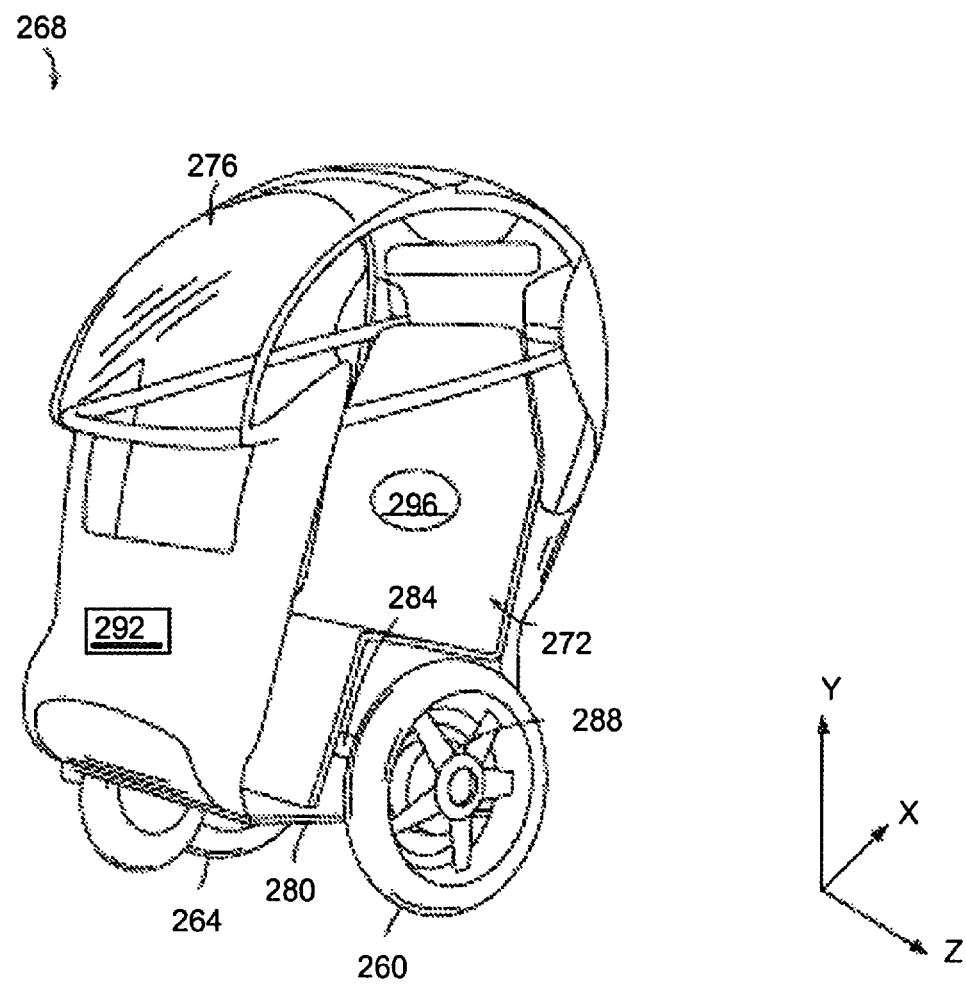
FIG. 2B is a schematic illustration of a vehicle, according to an illustrative embodiment of the invention.

FIG. 2B is a three-dimensional view of a vehicle 268, according to an illustrative embodiment of the invention. A human subject (not shown) rests on a support 272 in an enclosure 276 that at least partially encloses the human subject. The vehicle 268 includes two wheels 260, 264. The two wheels 260, 264 are coupled to a platform 280. Wheel 260 is laterally disposed to wheel 264. The wheels each rotate about an axle 284 and are powered by at least one drive 288 (e.g., a motorized drive). A controller (292) is coupled to the drive 288 for providing a control signal in response to changes in vehicle orientation (e.g., pitch) and position of the center of gravity 296 of the vehicle 268.

As the human subject mounts the vehicle 268, the controller 292 implements a control loop and senses a change in the vehicle's 268 orientation that can result from a change in the position of the center of gravity 296 in a fore-aft plane and controls power provided to the wheels 260, 264 based upon the change to the position of the center of gravity 296. In response to the change in the vehicle's 268 orientation and changes in the position of the center of gravity 296, torque is applied to the wheels 260, 264 to dynamically stabilize the vehicle 268, similarly as described in U.S. patent application Ser. No. 12/266,170 (the entire contents of which are hereby incorporated by reference in its entirety).

In one embodiment, as the position of the center of gravity 296 moves in a fore direction (toward the negative X-Axis direction), the drive 288 provides power to the two wheels 260, 264 sufficient to cause the vehicle 268 to move forward (toward the negative X-Axis direction). As the center of gravity 296 moves in the aft direction (toward the positive X-Axis direction), the drive 288 provides power to the two wheels 260, 264 sufficient to cause the vehicle 268 to slow and reverse direction such that the vehicle 268 moves backward (toward the positive X-Axis direction.

The pitch of the vehicle 268 (angular orientation of the vehicle 268 about the axle 284) may also be sensed and compensated for in the control loop. The controller includes gyroscopes for sensing orientation of the vehicle 268 that can result from changes in the position of the center of gravity 296.

Vehicle 268 pitch variation is decreased during operation when the vehicle 268 is dynamically stabilized based on the change in the position of the support portion relative to the platform portion (e.g., support portion 172a and platform portion 172b of FIG. 1) rather than in response to a change in pitch. It also shortens the time it takes the vehicle 268 to respond to an acceleration and/or deceleration command. The vehicle 268 accelerates and/or decelerates by restoring the position of the center of gravity 296 of the vehicle 268 over the location that the wheels 260 and 264 contact the ground. If the vehicle 268 was accelerated and/or decelerated in response to a change in pitch, a controller of the vehicle 268 would first need to induce a change in the position of the center of gravity 296 relative to a steady state position and then command the drive 288 to operate the wheels 260 and 264 in such a manner as to position the center of gravity 296 above the location where the ground-contacting elements contact the ground. The time required to induce a change in the position of the center of gravity 296 back to the steady state position is a time delay for the vehicle 268 to respond to an acceleration and/or deceleration command compared to acceleration and/or deceleration in response to a change in the position of the center of gravity. The vehicle 268 does not need to induce the change in the position of the center of gravity 296 from a steady state because the change of the position of the center of gravity 296 is inherent in the acceleration and/or deceleration command. The acceleration and/or deceleration command necessitates a change in the orientation of the vehicle 268 to position the center of gravity 296 in the correct position so that acceleration and/or deceleration can begin.

Figure 3:
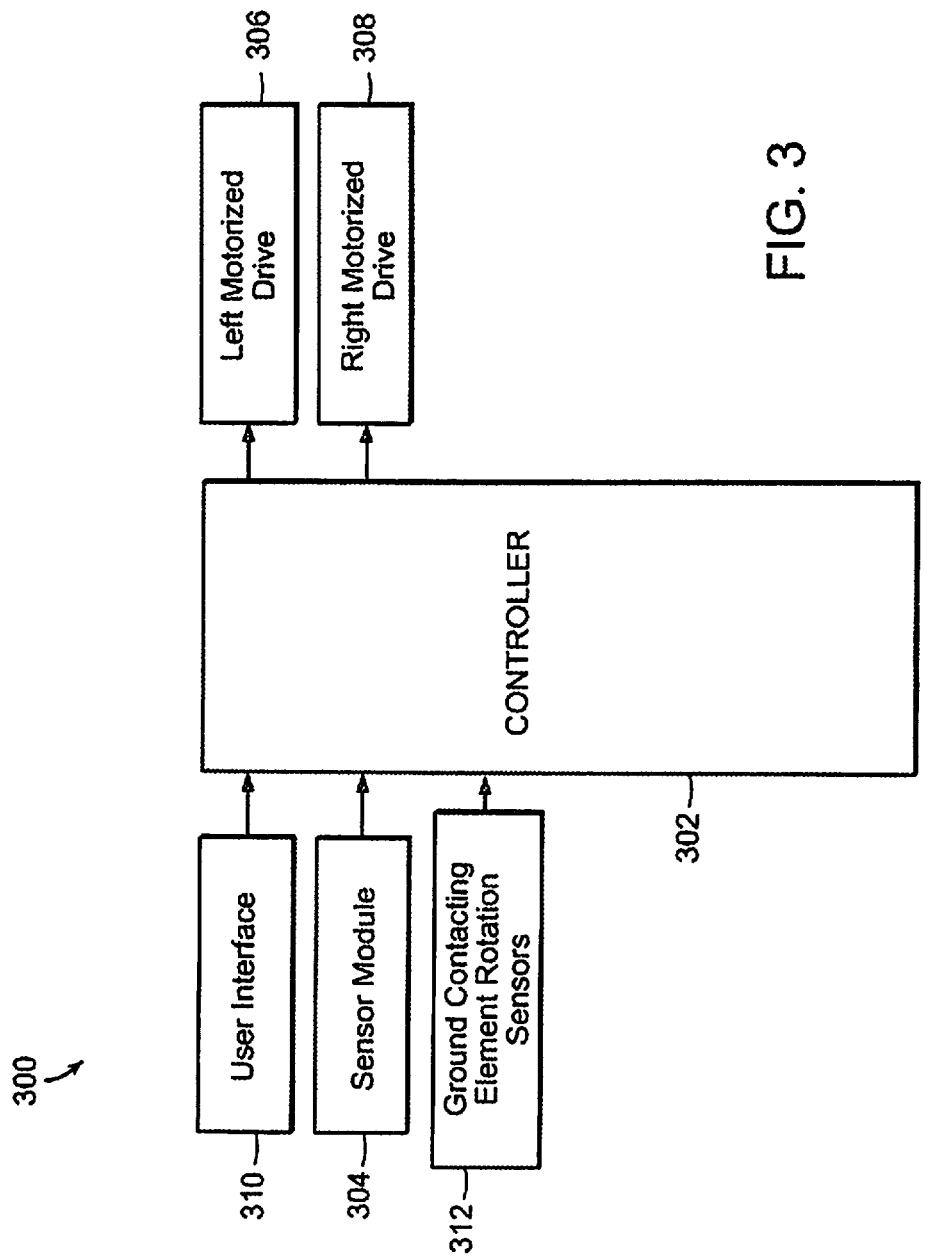
FIG. 3 is a block diagram of a control system for dynamically controlling the stability of a vehicle, according to an illustrative embodiment of the invention.

FIG. 3 is a block diagram of a control system 300 for dynamically controlling the stability of a vehicle having two laterally disposed wheels (e.g., wheels 260 and 264 of FIG. 2B), according to an illustrative embodiment of the invention. A controller 302 (e.g., controller 400 of FIG. 4) receives an input characteristic of a position of the support portion (e.g., support portion 172a of FIG. 1) relative to the platform portion (e.g., platform portion 172b of FIG. 1) which affects the location of the center of gravity of the vehicle, from a sensor module 304. Based on at least the position of the support portion relative to the platform portion provided by the sensor module 304, the controller 302 commands torque T of at least one of the left motorized drive 306 or right motorized drive 308 (e.g., torque applied to the corresponding ground-contacting elements).

FIGS. 3A and 3B are block diagrams that illustrate the effect of the position of the center of gravity 322 of a vehicle 330 on operation of the vehicle 330, according to an illustrative embodiment of the invention. The vehicle 330 has a total mass $M_2$ (weight of $M_2g$). The mass of a payload and a portion of the vehicle 330 is denoted as $M_1$ (weight of $M_1g$) which corresponds to the mass of the center of gravity 322. The mass of two laterally disposed contacting elements 320 is denoted as mass $M_0$ (weight of $M_0g$). The weight of the vehicle 330 is expressed as:

$$M_2g = M_1g + M_0g \qquad \text{EQN. 1}$$

The portion of the vehicle 330 capable of moving along the X-Axis direction relative to the position of the ground-contacting elements 320 is represented by the center of gravity 322. Referring to FIG. 3A, the center of gravity 322 is located at an initial location 334 above the location 338 where the ground-contacting elements 320 contact the ground.

Referring to FIG. 3B, the center of gravity 322 is located at a location 342, at a distance L along the negative X-Axis direction relative to the initial location 334. In one embodiment, the center of gravity 322 is positioned at location 342 by a human subject moving the position of the center of gravity of the vehicle 330. The sensor module 304 (of FIG. 3) provides the pitch of the vehicle 330 and the orientation of the vehicle 330 to the controller 302. The pitch and orientation change as the position 342 of the center of gravity 322 changes. The controller 302 outputs a signal to the left motorized drive 306 and right motorized drive 308 to apply a torque $[T=(M_1 g)(L)]$ to the ground-contacting elements 320 to cause the ground-contacting elements 320 to move in the direction (e.g., forward along the negative X-Axis direction) the center of gravity 322 has been displaced from the previous location 338 to maintain balance of the vehicle 330.

The masses of the vehicle 330 can be advantageously distributed between the payload and related structure (collectively 322) and the ground contacting-elements and related structure (collectively 320) to maximize acceleration and deceleration performance. In one embodiment, it is advantageous to locate a larger percentage of the total vehicle 330 mass with the moving portion of the vehicle 330 (i.e., with the payload and related structure 322) to maximize acceleration and deceleration performance. Placing more of the total vehicle 330 mass with the moving portion 322 enables the larger amount of mass to contribute to generating the motor commands required to accelerate or decelerate the vehicle 330. If, however, more of the total vehicle 330 mass was placed with the ground-contacting elements and related structure 320, the larger percentage of mass would be a load that the vehicle 330 needs to move as part of the entire vehicle 330.

The controller 302 also interfaces with a user interface 310 and a wheel rotation sensor 312. The user interface 310 can, for example, include controls for turning the vehicle on or off, or for triggering different operating modes of the vehicle.

The sensor module 304 detects one or more vehicle parameters to determine a change in the position of the center of gravity of the vehicle (e.g., due to movement of the support portion 172a relative to the platform portion 172b of the vehicle 100 of FIG. 1). In one embodiment, the sensor module 304 generates a signal indicative of a change in the position of the center of gravity at one instance in time with respect to the position of the center of gravity at another instance in time. For example, a distance sensor attached to a spring, a load sensor, an inclinometer, a gyroscope, whiskers and/or an angular rate sensor can be used to determine a change in the center of gravity of the vehicle. Other sensors (e.g., optical sensors and/or magnetic sensors) can also be employed and are therefore within the scope of the present invention.

The controller 302 includes a control algorithm to determine the amount of torque to be applied by the left motorized drive 306 and/or right motorized drive 308 based on the slide position (i.e., support portion relative to the platform portion). The control algorithm can be configured, for example, during the design of the vehicle or in real time, on the basis of a current operating mode of the vehicle, operating conditions experienced by the vehicle, as well as preferences of a human subject.

As an example, not meant to be limiting, the control algorithm can take the form:

$$\text{Torque Command} = K \cdot (C+O) \quad \text{EQN. 2}$$

where K is the gain, C is a vector defining the position of the center of gravity of the vehicle, and O is an offset. The position of the center of gravity, C, can be in the form of an error term defined as the desired position of the slide (support portion relative to the platform portion) minus the sensed position of the slide. Changing the slide position can be the method used to affect the position of the CG. The desired position of the slide can be for example, a predetermined constant in the control algorithm. Alternatively, a human subject in the vehicle can set the position of the slide via a user interface. In this embodiment, upon starting the vehicle and prior to allowing movement of the vehicle, a human subject can activate a switch on the vehicle that triggers determination of the desired position of the slide based on inputs received from the sensor module. This allows the human subject to acquire a known initial position of the slide, from which the human subject can then deviate so as to cause a change in the position of the slide (causing a change in the position of the CG).

The gain, K, can be a predetermined constant, or can be entered or adjusted by the human subject through the user interface 310. Gain K is, most generally, a vector, with the torque determined as a scalar product of the gain and the position of the slide displacement vector. Responsiveness of the vehicle to changes in the position of the slide can be governed by K. For example, increasing the magnitude of at least one element of vector K causes a human subject to perceive a stiffer response in that a small change in the position of the slide results in a large torque command.

Offset, O, can be incorporated into the control algorithm to govern the torque applied to the left motorized drive 306 and right motorized drives 308, either in addition to, or separate from, the direct effect of C. Thus, for example, the human subject can provide an input by means of the user interface 310 (e.g., input 106 of FIG. 1), the input is treated by the controller 302 equivalently to a change, for example, in the position of the slide.

In one embodiment, steering can be accomplished by calculating the torque desired for the left motorized drive 306 and the torque desired for the right motorized drive 308 separately. Additionally, tracking both the left wheel motion and the right wheel motion permits adjustments to be made, as known to persons of ordinary skill in the control arts, to prevent unwanted turning of the vehicle and to account for performance variations between the left motorized drive 306 and the right motorized drive 308.

Steering may be accomplished in an embodiment having at least two laterally disposed ground-contacting elements (e.g., a left and right wheel), by providing, for example, separate motors for left and right ground-contacting elements. Torque desired for the left motor and the torque desired for the right motor can be calculated separately. Additionally, tracking both the left ground-contacting element motion and the right ground-contacting element motion with the ground-contacting element rotation sensors 312 permits adjustments to be made, as known to persons of ordinary skill in the control arts, to prevent unwanted turning of the vehicle and to account for performance variations between the two motors. In some embodiments, steering sensitivity is adjusted to a higher sensitivity when a vehicle is at lower speeds and lower sensitivity when a vehicle is at higher speeds to allow, for example, easier steering at higher speeds.

In some embodiments, the control system 300 limits the speed of the vehicle. The speed limit can be set based on, for example, a maximum speed associated with the operating mode of the vehicle or an input from the human subject.

In one embodiment, the control system 300 includes a speed limiting algorithm that regulates the speed of the vehicle by controlling the pitch of the vehicle. The controller 302 changes the pitch of the vehicle which moves the position of the center of gravity. Changes in the position of the center of gravity cause the vehicle to accelerate or decelerate depending on which direction the center of gravity is moved. The speed limiting algorithm causes the controller 302 to limit the speed of the vehicle by adjusting a desired pitch angle $\Theta_D$. The pitch control loop of the system 300 controls the system 300 to achieve the desired pitch angle $\Theta_D$.

The adjustment of the desired pitch angle $\theta_D$ is determined based on the following relationship:

$$\Theta_D = K1 * \left[ \overbrace{\frac{A}{K2*(V_{SpeedLimit} - V_{cm})}} + \overbrace{\frac{B}{K3*(IntegratedSpeedError)}} + \overbrace{\frac{C}{K4*(\text{Acceleration})}} \right] \quad \text{EQN. 3}$$

where $V_{SpeedLimit}$ is the current maximum allowed speed of the vehicle, $V_{cm}$ is the speed of the vehicle, K2 is a gain proportional to the difference between the vehicle's speed limit and the vehicle's actual speed, K3 is a gain on the Integrated Speed Error, which is the integrated difference between the vehicle's speed limit and the vehicle's actual speed, K4 is a gain on the acceleration of the vehicle, K1 is a gain on the overall calculated desired pitch that can be a function of, for example, a position of the center of gravity of the vehicle, and $\theta_D$ is the desired pitch angle. The cumulative effect of terms A, B and C in EQN. 3 is to cause the vehicle to pitch backward into a deceleration orientation if the forward speed limit is exceeded. The value of the desired pitch angle, $\theta_D$ is varied in the control system 300 to control the speed of the vehicle.

In one embodiment, the desired pitch angle $\theta_D$ remains constant (e.g., the vehicle remains level with respect to the ground plane). When a predefined maximum speed limit is reached, the control system 300 responds by setting the desired pitch angle $\theta_D$ to a value to decelerate the vehicle to prevent the vehicle from exceeding the maximum speed limit. This has the effect of the control system 300 commanding the vehicle to pitch backwards which causes the speed of the vehicle to decrease.

In some embodiments, the control system 300 is configured to account for the human subject commanding the vehicle to slow down. When the control system 300 determines that the human subject has caused the position of the center of gravity to shift rearward, the controller reduces the value of the gain K1. By reducing the value of the gain K1, the pitch angle terms in the control system 300 (governed by, for example, EQN. 3) are de-emphasized. Because the control system 300 de-emphasizes the pitch angle terms, the control system 300 does not command the vehicle to pitch backwards as much as it would in the absence of the human subject commanding the vehicle to slow down.

Figure 4:
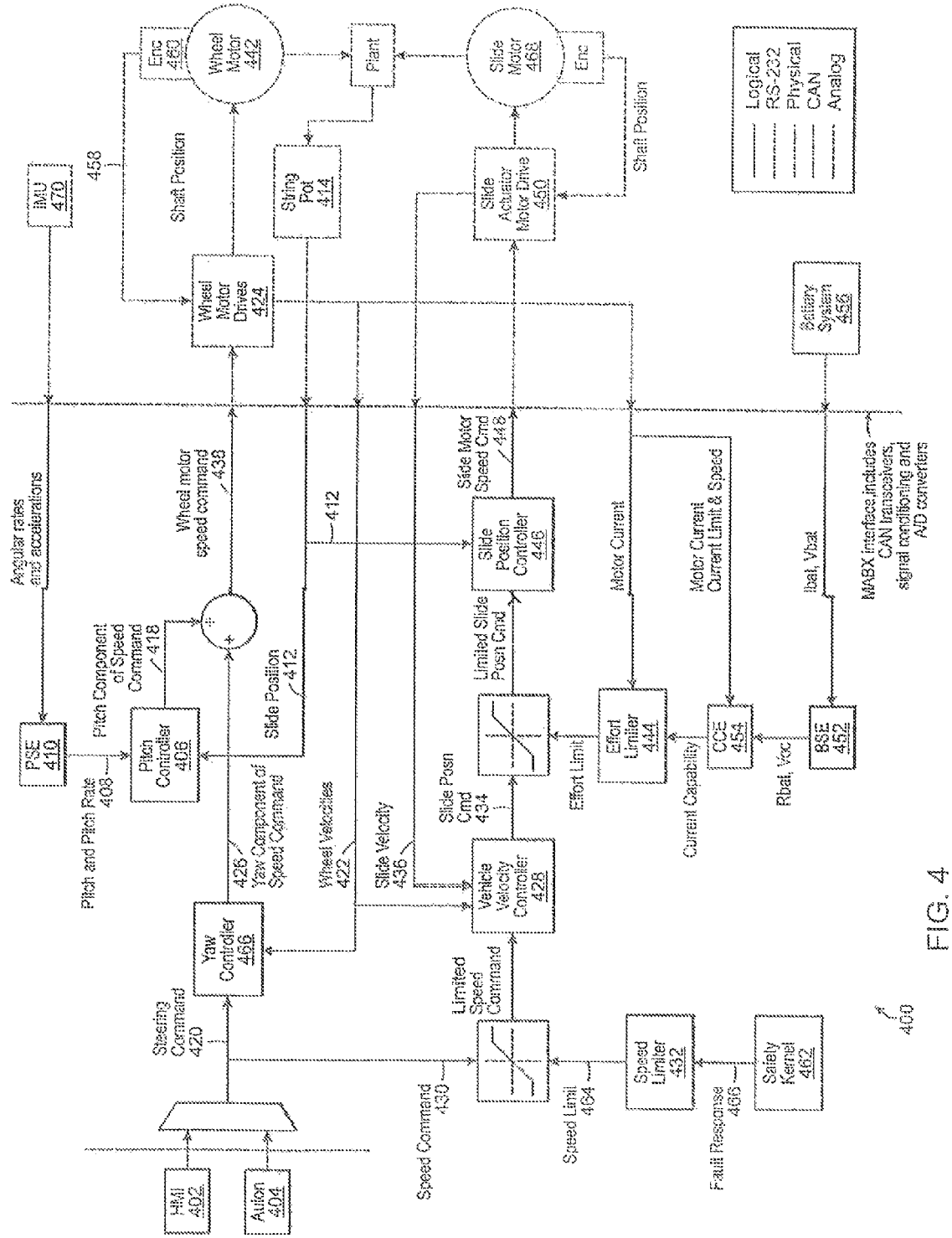
FIG. 4 is a block diagram of a controller for controlling the operation of a vehicle, according to an illustrative embodiment of the invention.

FIG. 4 is a block diagram of a controller 400 for controlling the operation of a vehicle (e.g., vehicle 100 of FIG. 1), according to an illustrative embodiment of the invention. The vehicle's dynamic response to a rider's 402 or a controller's 404 (e.g., autonomous) input commands, terrain, payload, wind load, and system capability can be managed by a number of nested and cooperative closed-loop system controllers. The pitch controller 406 maintains dynamic stability of the vehicle. The pitch controller 406 can take feedback data from various sources, for example, pitch and pitch rate 408 from the pitch state estimator (PSE) 410, and slide position 412 from slide-mounted string potentiometer 414 (or, an other suitable sensor that provides a measure of the position of, for example, the support portion of the coupling structure relative to the platform portion of the coupling structure). The pitch controller 416 can output wheel motor speed commands 418 to keep the vehicle chassis (e.g., support) level.

The vehicle's yaw controller 466 can take, as input, steering commands from the HMI 402 (or the controller 404) and compare the steering commands 420 to the wheels speeds 422 from the wheel motor drives 424 to create wheel motor speed command components 426 needed to steer and turn the vehicle. The wheel motor speed commands 438 can include a command component for the vehicle's propulsion and a command component for the vehicle's steering. In some embodiments, the steering command component 426 is added to the propulsion command component 418 (from the pitch controller 406) for one wheel and subtracted from the propulsion component 418 for the other wheel.

The vehicle's velocity controller 428 can take, as input, vehicle speed commands 430 from the HMI 402 (or the controller 404), that have, if necessary, been limited by the vehicle's speed limiter 432. The vehicle's velocity controller 428 can create slide position commands 434 to adjust the position of the slide affecting the position of the CG and thus, adjust torque applied by the wheels to an underlying surface to adjust the acceleration and speed of the vehicle. The vehicle's velocity controller 428 can receive velocity feedback from both the wheel 422 and the slide 436 motor drives.

Wheel speed command components 418 and 426 can be output from the pitch 406 and yaw 466 controllers and can be combined to create overall motor speed commands 438 that the vehicle can use to balance, steer and drive the vehicle. The resulting wheel speed commands 438 can be sent to wheel motor drives 424 which can control the speeds of the wheel motors 442. The wheel motor drives 424 can be digitally controlled, sine modulated, and permanent magnet motor drives.

A slide position command 434 can be output from the vehicle's velocity controller 428, which may be limited by the effort limiter 444, can be input to a slide position controller 446. The slide position controller 446 compares the slide position command 434 to the actual slide position 412 from the string potentiometer and outputs slide motor speed command 448. The motor speed command 448 can be input to slide actuator motor drive 450 which can control the slide's motor 468 speed.

Inside the vehicle's wheel motor drives 424, there can be motor speed loops to control motor current loops which can control duty cycles of power bridges that can output varying 3-phase voltages to the vehicle's wheel motors 442. The vehicle's wheel motor positions 458 can be fed back to the wheel motor drives 424 from motor shaft encoders 460 for commutation and for closing the speed loop. The speed controllers can be configured with proportional gains. Thus, a steady-state speed error can develop under a load. The presence of a steady-state speed error can help ensure that loads carried by redundant motors, if implemented, are shared in a reasonably well-balanced fashion. A current limiter in each wheel motor drive 424 can protect the motor drives 424 and their motors 442 from overheating while allowing peak torque capability for short durations and continuous torque capability for indefinite periods of operation.

In order to know how much to limit the effort demanded of the propulsion system, the wheel motor current capability can be estimated. The motor current capability can be estimated by knowing the present motor speed, current and current limits, which can be fed back from the wheel motor drives 424, and the estimated battery resistance and open-circuit voltage from the battery state estimator (BSE) 452. Thus, the BSE 452 can use the current and terminal voltage fed back from the battery 456 to estimate the battery resistance by monitoring how much the battery voltage changes in response to battery current changes. The BSE 452 can estimate the open-circuit battery voltage (the no-load voltage) from the actual battery current and terminal voltage and the battery's estimated resistance.

Using as inputs the battery state estimates from the BSE 452, and the motor current, current limit and speed feedback from the wheel motor drives 424, the motor current capability estimator (CCE) 454 can estimate the motor current that the vehicle's propulsion system can produce at any point in time. The current capability can be passed to the effort limiter 444, which limits the slide position to keep a margin between the commanded current and the current capability of the system, thus balancing and steering capability can be maintained. The vehicle's motor drives 424 can include current limiting algorithms to adjust the vehicle's motor current between peak and continuous limits. The limits are selected to protect both the motors 442 and the drives 424. Any time the commanded or target current is above a drive's continuous limit, the drive's enforced limit can slew down to the drive's continuous limit. When the motor target current drops below the continuous limit, the enforced limit can slew back up to the peak limit. The enforced limits can be fed back from the drives 424 to the CCE 454.

The vehicle's speed limiter 432 can set the top speed limit of the system and implement a slowdown response that can be requested by the vehicle's safety kernel 462. Thus, the speed limiter 432 can pass a speed limit value 464 to the vehicle's velocity controller 428, which enforces it. As the safety kernel 462 determines that a slowdown response is needed, it can request a slowdown response from the speed limiter 432. The speed limiter 432 can calculate a time-varying speed limit that can be used for the slowdown response and pass the time-varying speed values to the velocity controller 428.

There are several responses to hazards and faults 466 that the safety kernel 462 can issue that can result in changing the speed limit. For example, limit-speed response, zero-speed response, full-system safety shutdown, and half-system safety shutdown (for redundant systems). They are similar in the fact that they can all cause the system to decelerate; and differ on the values they can limit to and the rates they can cause the system to decelerate at. Additionally, safety shutdown responses can be coupled with landing (transitioning to a statically-stable state) and power down commands once the system has reached zero speed.

The vehicle's limit-speed response can be issued under transient conditions such as when an inertial measurement unit (IMU) 470 is "dizzy". Once the transient condition disappears (e.g., no longer turning fast) the limit on speed can be slowly lifted. The zero-speed response can be issued, for example, if the conditions causing the limit-speed response persist, and the system can set the speed limit to zero fairly rapidly.

The safety shutdown responses can be issued when the system has encountered a fault that requires the system to come to rest and power down. A safety shutdown brings the system to zero speed. The rate at which the system is brought to zero speed can vary with the type of safety shutdown. In cases where the full system is available, the system can decelerate at the maximum possible rate to minimize the time the system remains on while faulted. For redundant systems in the half-system case, the slowdown rate can be cut in half because the system only has half capability and trying to decelerate at maximum full system rates can increase the likelihood of saturating the half-system capability. The speed limiter 432 can inform the safety kernel 462 when it has achieved its task, but sometimes can delay the feedback to ensure, for example, that the system dynamics have settled before issuing land and power-down commands.

The pitch controller 406 can use estimated feedback data for pitch and pitch rate 408. These estimates can be calculated in the Pitch State Estimator (PSE) 410 from raw angular rate and accelerometer data from the IMU 470.

The pitch controller 406 can be a closed-loop controller and can be the primary balancing function. The pitch controller 406 has as inputs information about the desired and measured pitch orientations of the vehicle with respect to gravity and can create commands for the actuators to provide stabilizing forces. These forces, while providing stability in the pitch axis, concurrently provide a propulsive force for the general fore/aft motion of the vehicle. The output 418 of the pitch controller 406 is a component of the overall propulsion command and can be added to the other components in another module.

The pitch controller 406 can include four terms, the sum of which can constitute the pitch command. The first term can be a gain applied to the difference between the desired and measured/estimated pitch, also known as the "error." The product of the gain and the error is commonly referred to as a "proportional term." When applied to the balancing vehicle, the proportional term drives the vehicle in the direction of the vehicle pitch or "lean." An additional degree of freedom represented by the linear slide actuator can require compensation in the first term of the pitch controller. A pitch offset can be applied as a function of the slide position. The pitch offset term offsets a desired pitch by a current slide position multiplied by an empirically-derived gain. This can be done to compensate for the increasing torque demand on the wheel actuator as the distance to the overhung load is increased in magnitude. The distance to the overhung load is calculated as the fore/aft distance from the neutral balance point (not from the center of slide travel). The second term can be a gain applied to the pitch rate data. This term is commonly referred to as a "rate term." A rate term opposes pitch motion, and thus can resist changes in orientation. It can be a source of damping in the controller.

The third term can be for a motor drive that controls speed or voltage. It can be a "feed-forward term" based on average speed of the left and right wheel motors. This term can be used to provide some steady state command for a given vehicle speed so as to reduce the need for pitch error to grow as speed increases. This term can be unnecessary for the pitch controller when directly commanding motor current. The fourth term can be for slide motion compensation. As the slide moves it imparts disturbance forces on the system. This term can be a "feed-forward term" based on slide motion. The term can be used to provide some damping when there is relative motion between the support portion of the coupling structure of the vehicle relative to the platform portion of the coupling structure of the vehicle. It can perform the function of adding damping when the pitch loop is excited by any relative motion between the support portion relative to the platform portion.

In one embodiment, the method is implemented using a velocity controller (referring to the vehicle velocity controller 428 of FIG. 4 used to control operating speed of vehicle 100 of FIG. 1). The velocity controller is a closed-loop controller that regulates the fore/aft motion of the vehicle. It accomplishes this through the combined effects of controlling the slide controller 446 and the pitch controller 406. The velocity controller 428 calculates a desired position for the slide which the slide position controller carries out. The resulting shift in the position of the center of gravity (CG) in turn can induce motion by causing pitch error, and thus wheel motion can be driven by the pitch controller.

The velocity controller 428 can be a high-level controller that can utilize lower-level controllers directly (slide) and indirectly (pitch) to control the plant. The output of the velocity controller can be a desired slide position that feeds the slide controller. By positioning the enclosure 102, support 104, and support portion 172a of the coupling structure 172 and battery mass relative to the wheels 110, the velocity controller 428 can induce commands in the pitch loop which in turn can give rise to vehicle accelerations which the velocity controller can utilize to achieve its goal.

The target of the velocity loop can be calculated from one of two sources, either the manual controls 402 or the controller 404. The velocity controller 428 is capable of switching between these two sources while the loop is closing to achieve the operational goals of the system, including mode switching on the fly. The velocity controller 428 can have a proportional term and an integral term. The integral term can be important for several reasons. It can provide the system with its station-keeping capability on flat ground, inclined surfaces, in the presence of external disturbances (e.g., wind) and compensate for the variation in system losses that occur over the working speed range to effectively achieve the target.

The velocity controller 428 feedback is a combination of wheel velocity 422 and slide velocity 436. This can be important for the stability of the velocity loop. Consider a hypothetical case where the system is at rest and the velocity controller 428 is using only the average of all the present wheel speeds as feedback. If forward speed is desired, the slide can be moved forward. As the slide moves forward, there is a reaction force on the chassis which can cause the wheels to roll backwards. This rolling backwards can increase the velocity error and push the slide further forward, which in turn can increase the backward rolling and so forth creating positive feedback. By taking the vehicle velocity to be the sum of the average of the present wheel and slide speeds this undesired response can be remedied because as the wheels are moving back the slide can be moving forward which can have the tendency to cancel the effect.

The reverse mode of operation can be implemented by setting limits on the velocity target based upon the forward/reverse state. In the reverse mode some small speed limit can be allowed (e.g., less than 3 mph) and in forward mode no reverse motion can be allowed. Forward motion commands can be allowed in both modes; forward mode can be thought of as a reverse motion inhibit mode. Transitions between modes can be regulated by system dynamic data and a mode input switch (e.g., operable by a user or autonomous controller). In one embodiment, to enable reverse mode when in forward mode, the criteria can be: the system speed must be low, the velocity target must be low, and the forward/reverse mode button must be pressed. The request can be not latched. To enable forward mode when in reverse mode, one can toggle modes with same criteria for entering reverse mode or push the throttle input forward if the system is at zero speed.

Take-Off and Landing

Figure 5:
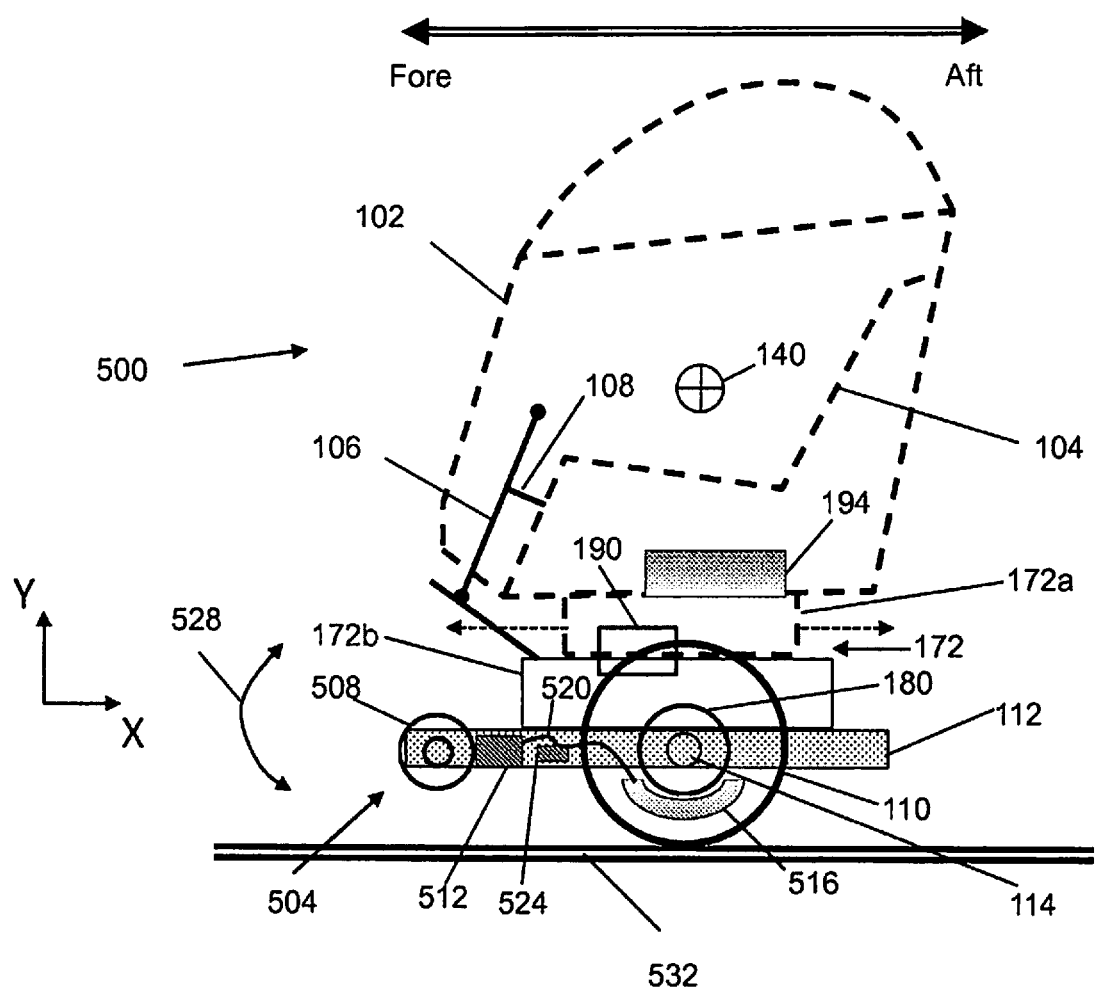
FIG. 5 is a schematic illustration of a vehicle, according to an illustrative embodiment of the invention.

FIG. 5 is a schematic illustration of a vehicle 500, according to an illustrative embodiment of the invention. The vehicle 500 is similar to the vehicle 100 of FIG. 1 and, common reference numbers refer to common elements. The vehicle 500 includes landing gear 504 that is coupled to the vehicle 500. In this embodiment, the landing gear 504 includes a wheel 508. When the vehicle 500 is pitched forward (rotated along curve 528 toward the fore direction) by a predetermined amount, the landing gear 504 is in contact with the underlying surface 532. The combination of the landing gear 504 and the at least one wheel 110 maintain the vehicle 500 in a statically-stable state. In one embodiment, the at least one wheel 110 is a plurality of laterally disposed wheels. In another embodiment, the landing gear 504 is a plurality of skids, pads, or wheel assemblies that provide lateral stability to the vehicle 500 when the vehicle 500 is not powered. In this embodiment, the landing gear 504 is located fore of the at least one wheel 110; however, in some embodiments, the landing gear 504 is located aft of the at least one wheel 110.

The vehicle 500 also includes a master cylinder 512 coupled to the landing gear 504 and a brake 516 (e.g., a hydraulic caliper brake) coupled to the at least one wheel 110. The master cylinder 512 is coupled to the brake 516 by a hydraulic line 520. The combination of the master cylinder and hydraulic line 520 form an actuator system for engaging and disengaging the brake 516. Alternative actuator systems can be used to actuate the brake 516 in response to, for example, a predetermined condition being satisfied (e.g., load applied to the landing gear). The master cylinder 512 converts non-hydraulic pressure (e.g., displacement of a piston in the master cylinder 512 from contact with the underlying surface 532) into hydraulic pressure in the hydraulic line 520 to actuate the brake 516. The vehicle can also include a brake sensor 524 that monitors the vehicle 500 to determine if the brake 516 is engaged. In one embodiment, the brake sensor 524 is a fluid pressure sensor coupled to the hydraulic line 520 to measure fluid pressure in the hydraulic braking system. The combination of the master cylinder 512, brake 516, hydraulic line 520 and the brake sensor 524 form a braking system for the vehicle 500.

Figure 6A:
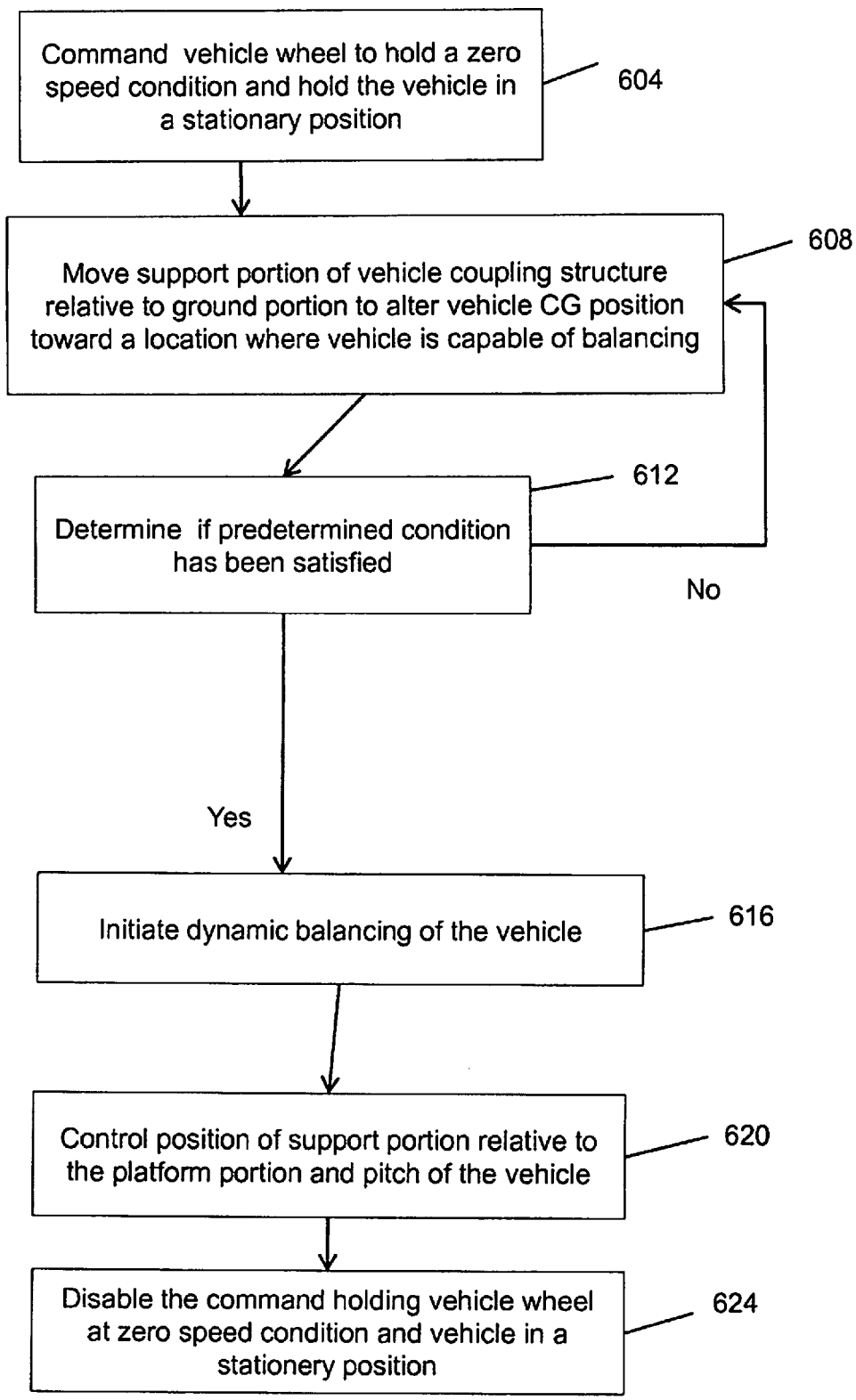
FIG. 6A is a flowchart of a method for transitioning a vehicle from a statically-stable state to a dynamically-balanced state.

FIG. 6A is a flowchart of a method for transitioning a vehicle (e.g., the vehicle 500 of FIG. 5) from a statically-stable state to a dynamically-balanced state. The method includes controlling (604) the drive (e.g., the drive 180 of FIG. 5) to command the at least one wheel (e.g., wheel 110 of FIG. 5) to hold a zero speed condition and to hold the vehicle in a stationery position with respect to an underlying surface. The method also includes controlling (608) the actuator (e.g., actuator 190 of FIG. 5) to move the position of the support portion of the coupling structure relative to the platform portion of the coupling structure to alter the position of the center of gravity of the vehicle towards a location where the vehicle is capable of balancing with the at least one wheel.

The method also includes determining if a predetermined condition has been satisfied (612). If the predetermined condition has not been satisfied, the vehicle (e.g., a controller of the vehicle) continues to monitor the operation of the vehicle to determine when the predetermined condition has been satisfied. If the predetermined condition has been satisfied, the method then proceeds with initiating (616) dynamic balancing of the vehicle with the at least one wheel (e.g., wheel 110 of FIG. 5). In some embodiments, the system determines whether the location of the vehicle center of gravity satisfies the predetermined condition. In one embodiment, the predetermined condition is satisfied when a load applied by the underlying surface to the vehicle landing gear (e.g., landing gear 504 of FIG. 5) is less than a predefined amount. In some embodiments, the system determines the load applied by the underlying surface to the landing gear using a fluid pressure sensor coupled to a hydraulic braking system that is coupled to the vehicle landing gear.

In some embodiments, the predetermined condition is satisfied when the vehicle pitches backward and the landing gear is no longer in contact with the underlying surface. In some embodiments, the predetermined condition is satisfied when the position of the support portion relative to the platform portion approaches a predefined threshold position (e.g., a position at which the position of the vehicle center of gravity is above the at least one wheel used to balance and propel the vehicle).

The method also includes controlling (620) the position of the support portion relative to the platform portion and controlling pitch of the vehicle to level the support. By way of example, at the point where the dynamic balancing controller is enabled, the support and platform are still tilted forward essentially as far as the support and platform were located when parked/stopped. The balancing (pitch) and slide position controllers then work together to adjust the support and platform tilt to a level state. This is done by slewing the desired pitch (via the pitch controller) from the parked angle to zero (e.g., leveling platform 112 of FIG. 1) while maintaining zero wheel velocity and position (via the speed controller). The method also includes controlling (624) the drive to disable the command that held the at least one wheel to a zero speed condition and held the vehicle in a stationery position with respect to the underlying surface. An operator may then, for example, command the vehicle to move.

Figure 6B:
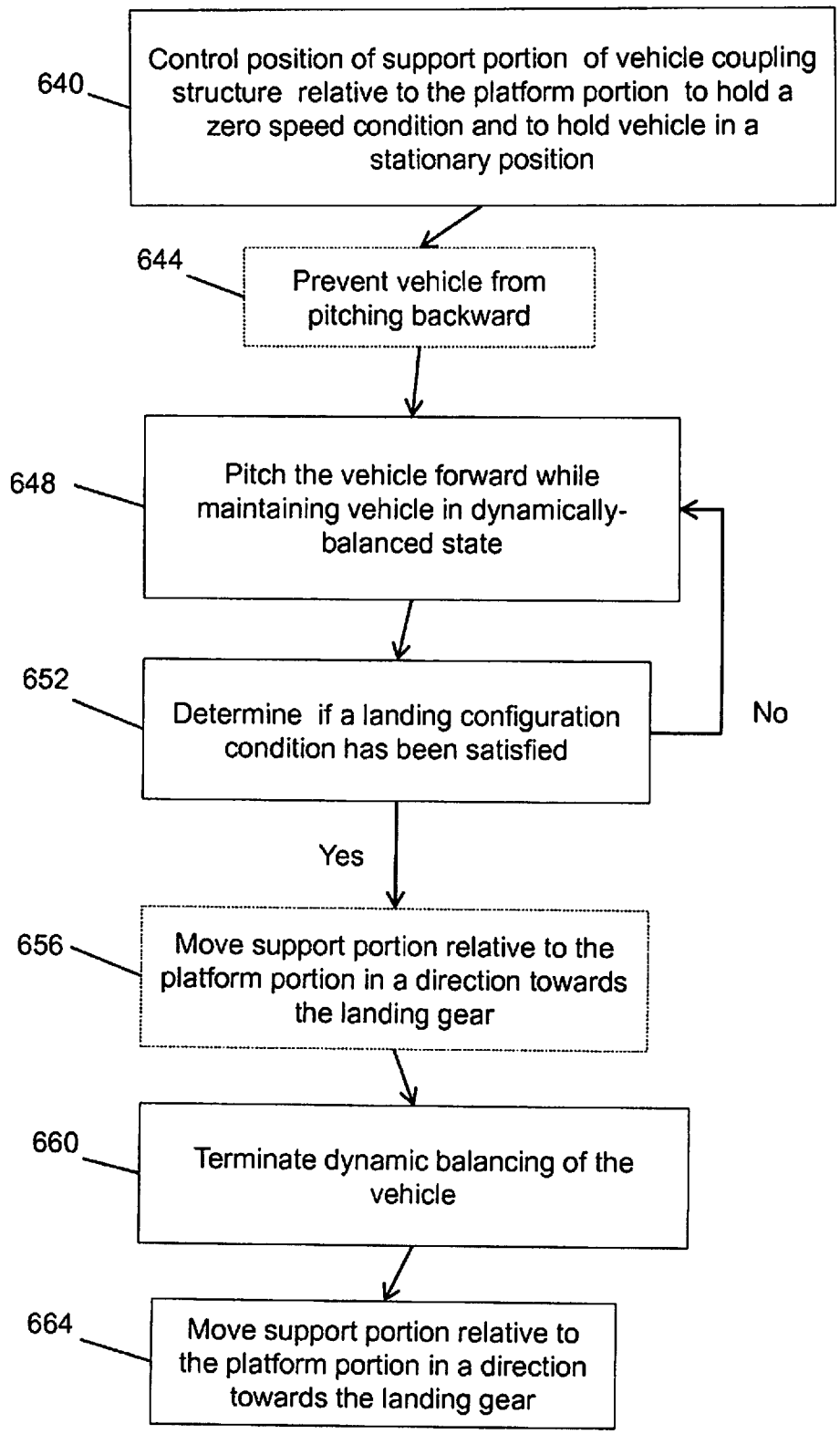
FIG. 6B is a flowchart of a method for transitioning a vehicle from a dynamically-balanced state to a statically-stable state.

FIG. 6B is a flowchart of a method for transitioning a vehicle (e.g., vehicle 500 of FIG. 5) from a dynamically-balanced state to a statically-stable state. The method includes commanding the actuator (640) to control the position (e.g., using the controller 400 of FIG. 4) of the support portion of the vehicle coupling structure relative to the platform portion of the vehicle coupling structure to hold a zero speed condition and to hold the vehicle in stationery position with respect to an underlying surface. The method also includes controlling the drive (648) to pitch the vehicle forward while maintaining the vehicle in a dynamically-balanced state. The method also, optionally, includes preventing (644) the vehicle from pitching backward after commanding the actuator to control the position of the support portion relative to the platform portion to hold a zero speed condition and to hold the vehicle in a stationary position with respect to the underlying surface.

The method also includes determining if a landing configuration condition has been satisfied (652). If the landing configuration condition has not been satisfied, the vehicle (e.g., a controller of the vehicle) continues to monitor the operation of the vehicle to determine when the landing configuration condition has been satisfied. When the landing configuration condition has been satisfied, the method then terminates dynamic balancing of the vehicle (660). The method also, optionally, includes commanding (656) the actuator to move the support portion relative to the ground portion in a direction towards the landing gear. By way of example, one motivation for performing step 656 prior to step 660, is to guarantee that the vehicle CG position is located some distance towards the landing gear and that the platform is at least somewhat statically-stable prior to terminating dynamic balancing of the vehicle (656). The method also includes moving (664) the support portion relative to the ground portion in a direction towards the landing gear following terminating balancing of the vehicle.

In some embodiments, the landing configuration condition is satisfied when a load applied by the underlying surface to the landing gear is greater than a predefined amount. In some embodiments, the load applied by the underlying surface to the landing gear is determined using a fluid pressure sensor coupled to a hydraulic braking system coupled to the landing gear of the vehicle (e.g., the braking system of FIG. 5). In some embodiments, the landing configuration condition is satisfied when the landing gear is in contact with the underlying surface. In some embodiments, the landing configuration condition is satisfied when the position of the support portion relative to the ground portion approaches a predefined threshold position (e.g., a position at which the position of the vehicle center of gravity is generally located between the landing gear and the at least one wheel (e.g., wheel 110 of FIG. 5)).

Vehicle Braking

Figure 7:
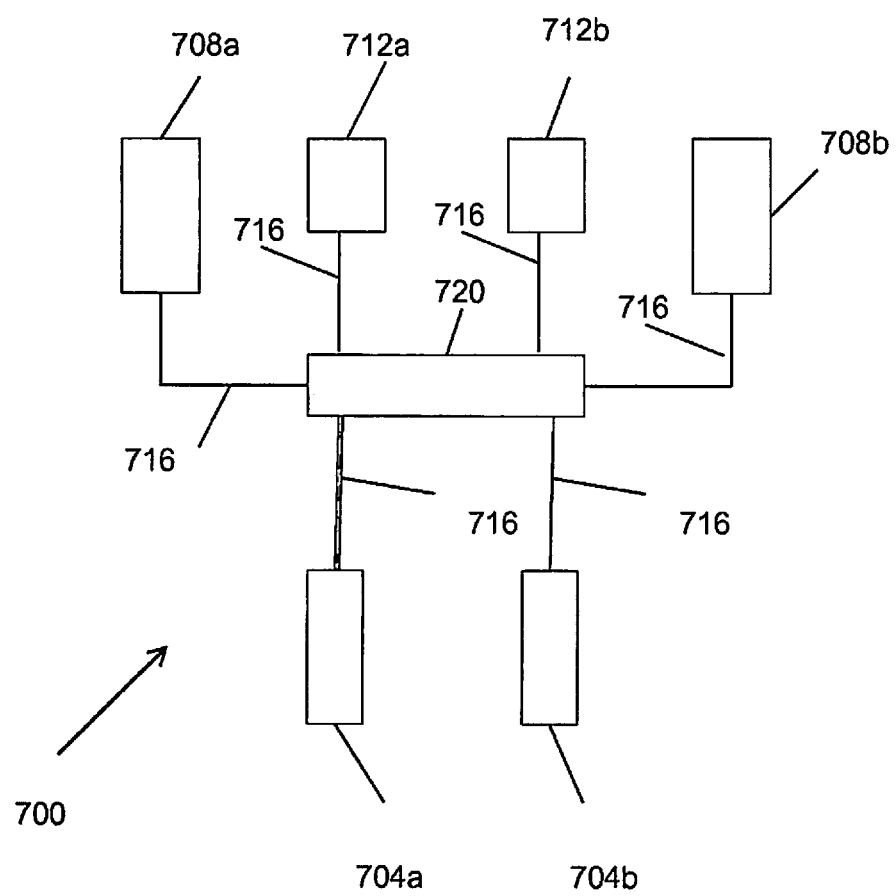
FIG. 7 is a schematic illustration of a braking system for a vehicle, according to an illustrative embodiment of the invention.

FIG. 7 is a schematic illustration of a braking system 700 for a vehicle, according to an illustrative embodiment of the invention. The braking system 700 may be used as, for example, a braking system for the vehicle 500 of FIG. 5. The braking system 700 includes two master cylinders 704a and 704b (generally 704). The master cylinders 704 are coupled to the vehicle landing gear (e.g., two sets of landing gear 504 of FIG. 5 laterally disposed relative to each other). Loads applied by the underlying surface to the landing gear are coupled to the master cylinders 704. The braking system 700 also includes two hydraulic brakes 708a and 708b (generally 708) coupled to two laterally disposed wheels of the vehicle (e.g., the wheels used to propel and dynamically balance the vehicle).

The master cylinders 704 and brakes 708 are coupled together using hydraulic lines 716. The master cylinders 704, brakes 708 and hydraulic lines 716 are coupled together via a common manifold block 720. The manifold block 720 causes the brakes 708 to be subject to the same hydraulic line pressure. When a load is applied to the landing gear/wheels, pistons in the master cylinders move and compress the hydraulic fluid in the hydraulic lines which increases the hydraulic pressure. The pressure in the hydraulic lines causes the brakes 708 to engage. When the load is removed from the landing gear/wheels, the pressure decreases in the hydraulic lines causing the brakes 708 to disengage. Two master cylinders 704 are used, and coupled to both brakes 708, to allow both brakes 708 to engage even if only one of the landing gear assemblies supports the vehicle (e.g., as when on uneven pavement).

The braking system 700 also includes two pressure sensors/switches 712a and 712b (generally 712). The pressure sensors/switches 712 provide a brake-state signal to a vehicle controller (e.g., the controller 400 of FIG. 4). In some embodiments, the controller prohibits the vehicle from entering a balancing mode when the brake-state signal is indicative of the brakes being engaged.

Figure 8:
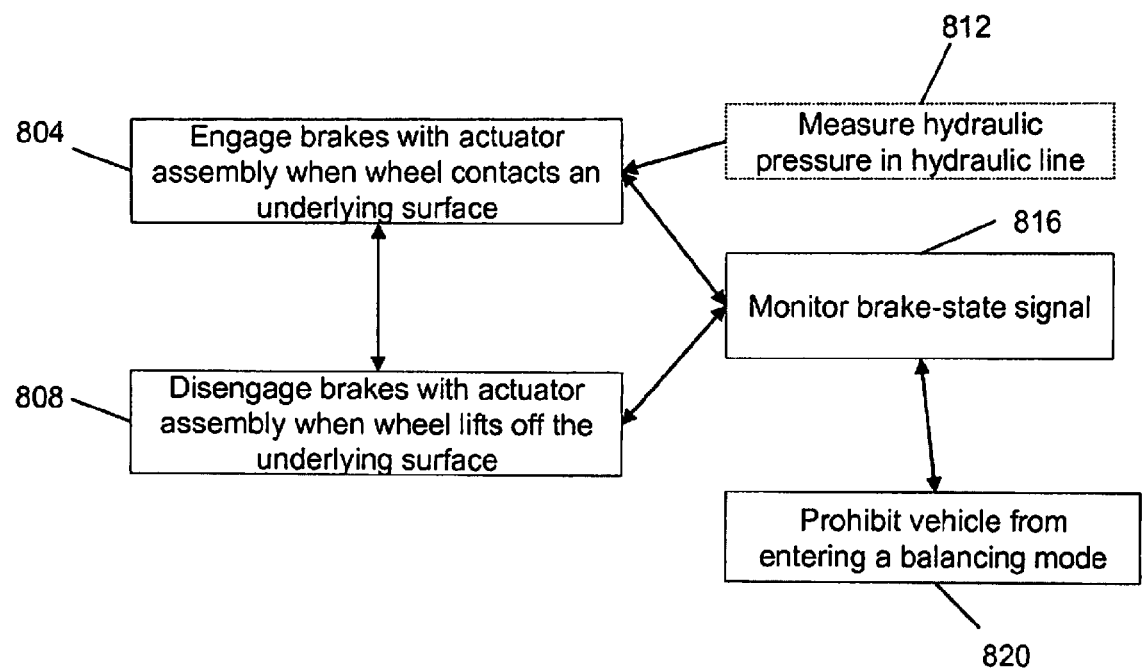
FIG. 8 is a flowchart of a method for braking a dynamically-balancing vehicle, according to an illustrative embodiment of the invention.

FIG. 8 is a flowchart of a method for braking a dynamically-balancing vehicle, according to an illustrative embodiment of the invention. The vehicle includes a support for supporting a payload, at least a first and second wheel coupled to the support, a drive coupled to the first and second wheels to dynamically balance the vehicle and provide power to the first and second wheels to propel the vehicle, a controller coupled to the drive to control the drive, at least a second wheel coupled to the support and disposed fore or aft of the first and second wheels, wherein the combination of the first, second and third wheels maintain the vehicle in a statically-stable state when the vehicle is operating in the statically-stable state, and a braking system comprising brakes coupled to the first and second wheels, and an actuator assembly coupled to the third wheel. The method includes engaging the brakes with the actuator assembly when the third wheel contacts an underlying surface (804). The method also includes disengaging the brakes with the actuator assembly when the third wheel lifts off the underlying surface (808).

In some embodiments, the actuator assembly for the braking system includes a master cylinder, the brakes are hydraulic brakes, and the braking system also includes hydraulic lines that couple the master cylinder to the hydraulic brakes.

In embodiments where the system includes hydraulic brakes and hydraulic lines, the method also includes measuring hydraulic pressure in the hydraulic lines to determine when a load is applied by the underlying surface to the third wheel (812). In these embodiments, step 804 is implemented in response to a load being applied by the underlying surface to the third wheel. The method also includes monitoring a brake-state signal (816) to determine whether the brakes are engaged. If a controller (e.g., controller 194 of FIG. 5) determines the brakes are engaged, the controller prohibits the vehicle from entering a balancing mode (820).

The described embodiments of the invention are intended to be merely exemplary and numerous variations and modifications will be apparent to those skilled in the art. All such variations and modifications are intended to be within the scope of the present invention as defined in any appended claims.

The invention claimed is:

1. A method for controlling a dynamically-balanced vehicle, the vehicle comprising a support, at least one wheel, a coupling structure having a support portion coupled to the support and a ground portion coupled to the at least one wheel that allows the support portion to move or slide fore and aft with respect to the ground portion, a drive coupled to the at least one wheel to dynamically balance the vehicle and provide power to the at least one wheel to propel the vehicle, an actuator coupled to the coupling structure to control fore-aft movement of the support portion relative to the ground portion, a controller coupled to the drive to control the drive and coupled to the actuator to control the actuator, the method comprising:

controlling the drive coupled to the at least one wheel in response to fore-aft pitch of the vehicle;

controlling fore-aft pitch of the vehicle using the actuator to control fore-aft movement of the support portion relative to the ground portion, comprising the steps of:

receiving user or autonomous selections for fore-aft travel of the vehicle;

influencing fore-aft movement of the support portion relative to the ground portion in response to a determined maximum speed for the vehicle; and limiting energy applied to the actuator in response to system conditions selected from the group consisting of batter condition, drive current and drive speed.

2. The method of claim 1, further comprising monitoring vehicle conditions for adjusting the determined maximum speed and changing signals from the step of influencing in the determined maximum speed.

3. The method of claim 1, wherein the maximum speed for the vehicle is determined in response to safety conditions.

4. The method of claim 1, wherein the step of controlling the drive includes controlling torque applied to the drive in response to fore-aft pitch of the vehicle.

5. The method of claim 1, wherein the vehicle comprises a pair of laterally disposed wheels, each having a separate drive coupled thereto, and further wherein the step of controlling the drive includes receiving user or autonomous selections for steering of the vehicle and providing separate control signals to each separate drive responsive to the user or autonomous selection for steering.

6. The method of claim 5, further comprising sensing rotational speed of each of the pair of laterally disposed wheels, and wherein the step of providing separate control signals is responsive to the sensed rotational speed.

* * * * *